United States Patent
Berggren et al.

(10) Patent No.: US 8,761,848 B2
(45) Date of Patent: Jun. 24, 2014

(54) NANOWIRE-BASED DETECTOR

(75) Inventors: Karl K. Berggren, Arlington, MA (US); Xiaolong Hu, Ann Arbor, MI (US); Daniele Masciarelli, Settimo Torinese (IT)

(73) Assignee: Massachusetts Institute of Technology, Cambridge, MA (US)

( * ) Notice: Subject to any disclaimer, the term of this patent is extended or adjusted under 35 U.S.C. 154(b) by 194 days.

(21) Appl. No.: 13/117,515

(22) Filed: May 27, 2011

(65) Prior Publication Data

US 2012/0077680 A1    Mar. 29, 2012

Related U.S. Application Data

(60) Provisional application No. 61/349,510, filed on May 28, 2010.

(51) Int. Cl.
*G01F 23/24* (2006.01)
*H01L 39/24* (2006.01)

(52) U.S. Cl.
USPC ............ 505/160; 505/411; 505/473; 505/237

(58) Field of Classification Search
USPC ......... 505/160, 330, 410–411, 473, 237, 191, 505/470; 427/63; 428/296, 195.1; 216/13; 250/200, 338.4; 438/2
See application file for complete search history.

(56) References Cited

U.S. PATENT DOCUMENTS

| | | | |
|---|---|---|---|
| 6,359,288 | B1 | 3/2002 | Ying et al. |
| 7,763,854 | B2 | 7/2010 | Frey |
| 2008/0272302 | A1 | 11/2008 | Frey et al. |
| 2013/0172195 | A1 | 7/2013 | Bellei et al. |

FOREIGN PATENT DOCUMENTS

| WO | WO 2011/150321 A1 | 12/2011 |
|---|---|---|
| WO | WO 2013/052864 A1 | 4/2013 |

OTHER PUBLICATIONS

International Search Report and Written Opinion for PCT/US2011/038314, mailed Aug. 18, 2011.
Dauler et al., "Multi-Element Superconducting Nanowire Single-Photon Detector," *IEEE Transactions on Applied Superconductivity*, vol., 17 (2), Jun. 2007, pp. 279-284.

(Continued)

*Primary Examiner* — Colleen Dunn
(74) *Attorney, Agent, or Firm* — Wolf, Greenfield & Sacks, P.C.

(57) ABSTRACT

Systems, articles, and methods are provided related to nanowire-based detectors, which can be used for light detection in, for example, single-photon detectors. In one aspect, a variety of detectors are provided, for example one including an electrically superconductive nanowire or nanowires constructed and arranged to interact with photons to produce a detectable signal. In another aspect, fabrication methods are provided, including techniques to precisely reproduce patterns in subsequently formed layers of material using a relatively small number of fabrication steps. By precisely reproducing patterns in multiple material layers, one can form electrically insulating materials and electrically conductive materials in shapes such that incoming photons are redirected toward a nearby electrically superconductive materials (e.g., electrically superconductive nanowire(s)). For example, one or more resonance structures (e.g., comprising an electrically insulating material), which can trap electromagnetic radiation within its boundaries, can be positioned proximate the nanowire(s). The resonance structure can include, at its boundaries, electrically conductive material positioned proximate the electrically superconductive nanowire such that light that would otherwise be transmitted through the sensor is redirected toward the nanowire(s) and detected. In addition, electrically conductive material can be positioned proximate the electrically superconductive nanowire (e.g. at the aperture of the resonant structure), such that light is directed by scattering from this structure into the nanowire.

44 Claims, 12 Drawing Sheets

(56) References Cited

OTHER PUBLICATIONS

Dorenbos et al., "Superconducting single photon detectors with minimized polarization dependence," *Applied Physics Letters*, vol. 93 (16), Oct. 2008, pp. 161102-1-161102-3.
Hu et al., "Efficiently Coupling Light to Superconducting Nanowire Single-Photon Detectors," *IEEE Transactions on Applied Superconductivity*, vol. 19 (3), Jun. 2009, pp. 336-340.
Hu et al., "Efficiently coupling light to superconductive nanowire single-photon detectors," Poster presented at the 2008 Applied Superconductivity Conference, Chicago, Illinois, Aug. 19, 2008.
Hu et al., "Mid-Infrared Single-Photon Detection Using Superconducting Nanowires Integrated with Nano-Antennae," 2010 Conference on Lasers and Electro-Optics (CLEO), 2010, San Jose, CA, pp. 1-2.
Hu et al., "Using Surface Plasmons to Enhance the Speed and Efficiency of Superconducting Nanowire Single-Photon Detectors," International Quantum Electronics Conference (IQEC)—Baltimore, MD, May 31, 2009.
Hu et al., "Fiber-coupled nanowire photon counter at 1550 nm with 24% system detection efficiency," Optics Letters, vol. 34 (23), Dec. 1, 2009, pp. 3607-3609.
Hu, X. "Efficient Superconducting-Nanowire Single-Photon Detectors and Their Applications in Quantum Optics," Ph.D. Thesis, Massachusetts Institute of Technology, Mar. 10, 2011.
Hu et al., "Superconducting nanowire single-photon detectors integrated with optical nano-antennae," Optics Express, vol. 19 (1), Jan. 3, 2011, pp. 17-31.
Kerman et al., "Electrothermal feedback in superconducting nanowire single-photon detectors," Physical Review B, vol. 79, Mar. 26, 2009, pp. 100509-1-100509-4.
Rosfjord et al., "Nanowire Single-photon detector with an integrated optical cavity and anti-reflection coating," *Optics Express*, vol. 14 (2), Jan. 23, 2006, XP-002491533, 8 pgs.
Yang et al., "Suppressed Critical Current in Superconducting Nanowire Single-Photon Detectors with High Fill-Factors," *IEEE Transactions on Applied Superconductivity*, vol. 19 (3), Jun. 2009: 318-322.
International Preliminary Report on Patentability for Application No. PCT/US2011/038314 mailed Dec. 13, 2012.
Invitation to Pay Additional Fees for Application No. PCT/US2012/058469 mailed Jun. 6, 2013.
Aharonovich et al., Diamond-based single-photon emitters. Rep Prog Phys. 2011;74:076501. 28 pages.
Annunziata et al., Niobium superconducting nanowire single-photon detectors. IEEE Transactions on Applied Superconductivity. Jun. 2009;19(3):327-31.
Baca et al., Semiconductor wires and ribbons for high-performance flexible electronics. Angew Chem Int Ed Engl. 2008;47(30):5524-42.
Bower et al., Active-matrix OLED display backplanes using transfer-printed microscale integrated circuits. Electronic Components and Technology Conference. 2010:1339-43.
Carlson et al., Transfer printing techniques for materials assembly and micro/nanodevice fabrication. Adv Mater. Oct. 9, 2012;24(39):5284-318. Epub Aug. 31, 2012.

Chen et al., Nanolasers grown on silicon. Nature Photonics. Mar. 2011;5:170-5.
Gol'tsman et al., Picosecond superconducting single-photon optical detector. Appl Phys Lett. Aug. 2001;79(6):705-7.
Hofherr et al., Superconducting nanowire single-photon detectors: Quantum efficiency vs. film thickness. 2010 J Phys: Conference Series 234 (2010) 012017. http://iopscience.iop.org/1742-6596/234/1/012017.
Jiao et al., Creation of nanostructures with poly(methyl methacrylate)-mediated nanotransfer printing. J Am Chem Soc. Sep. 24, 2008;130(38):12612-3. Epub Sep. 3, 2008.
Kim et al., Kinetically controlled, adhesiveless transfer printing using microstructured stamps. Applied Physics Letters. 2009;94:113502.1-.3.
Ko et al., A hemispherical electronic eye camera based on compressible silicon optoelectronics. Nature. Aug. 7, 2008;454(7205):748-53.
Marsili et al., Cavity-integrated ultra-narrow superconducting nanowire single-photon detector based on a thick niobium nitride film. Quantum Electronics and Laser Science Conference, QTu3E. San Jose, California. May 6, 2012. http://dx.doi.org/10.1364/QELS.2012.QTu3E.3.
Marsili et al., Single-photon detectors based on ultranarrow superconducting nanowires. Nano Lett. May 11, 2011;11(5):2048-53. Epub Apr. 1, 2011.
Marsili et al., Single-photon detectors based on ultranarrow superconducting nanowires. Nano Lett. May 11, 2011;11(5):2048-53. Epub Apr. 1, 2011. Supporting Information. 14 pages.
Meitl et al., Transfer printing by kinetic control of adhesion to an elastomeric stamp. Nature Materials. Jan. 2006;5:33-8.
Miki et al., Compactly packaged superconducting nanowire single-photon detector with an optical cavity for multichannel system. Opt Express. Dec. 21, 2009;17(26):23557-64.
Miki et al., Multichannel SNSPD system with high detection efficiency at telecommunication wavelength. Opt Lett. Jul. 1, 2010;35(13):2133-5.
Semenov et al., Quantum detection by current carrying superconducting film. Physics C 351. 2001;349-56.
Somani et al., New photon detector for device analysis: Superconducting single-photon detector based on a hot electron effect. J Vac Sci Technol B. Nov./Dec. 2001;19(6):2766-9.
Sprengers et al., Waveguide superconducting single-photon detectors for integrated quantum photonic circuits. Appl Phys Lett. 2011;99:181110.1-.3.
Verma et al., 55% system detection efficiency with self-aligned WSi superconducting nanowire single-photon detectors. CLEO Technical Digest. Quantum Electronics and Laser Science Conference. San Jose, CA. May 6, 2012. Detectors I (QTuIE). 2 pages.
Wang et al., Scanning probe contact printing. Langmuir. 2003;19(21):8951-5.
Wang et al., Scanning probe with elastomeric (PDMS) tip for scanning probe microcontact printing (SP-CP). The 12*th* International Conference on Solid State Sensors, Actuators and Microsystems. Boston, MA. Jun. 8-12, 2003:1003-6.
Yang et al., Enhancing etch resistance of hydrogen silsesquioxane via postdevelop electron curing. J Vac Sci Technol B. Nov./Dec. 2006;24(6):3157-3161.
Zhong et al., High-quality fiber-optic polarization entanglement distribution at 1.3 microm telecom wavelength. Opt Lett. May 1, 2010;35(9):1392-4.

NANOWIRE-BASED DETECTOR

RELATED APPLICATIONS

This application claims priority under 35 U.S.C. §119(e) to U.S. Provisional Patent Application No. 61/349,510, filed May 28, 2010, and entitled "Nanowire-Based Detector," which is incorporated herein by reference in its entirety for all purposes.

GOVERNMENT SPONSORSHIP

This invention was made with government support under Grant No. DE-SC0001088 awarded by the Department of Energy and Grant No. NSF0823778 awarded by the National Science Foundation and Contract No. NBCHC00671 awarded the Department of Interor. The government has certain rights in this invention.

FIELD OF INVENTION

Systems, articles, and methods related to nanowire-based detectors are generally described.

BACKGROUND

The use of nanowires in single-photon detectors is an emerging field of research. In many traditional nanowire-based detectors, one or more nanowires is positioned on a substrate toward which light is directed. As light is directed toward the nanowire(s), individual photons can couple with the nanowire(s) upon contact, producing a detectable signal. Often, such devices are designed to interact with a very small amount of light (e.g., single photons). In many cases, the nanowires within traditional nanowire-based detectors cover relatively small areas. The small active area of the detector can limit the extent to which incoming light can couple with the nanowire(s) of the detector, as many incoming photons are passed through or reflected by the substrate and the nanowire without interacting with the nanowire(s). While the active area of the detector could be increased by extending the length of the nanowire(s), extended nanowire lengths can lead to decreased detection speeds, as lengthening the nanowire increases the electrical inductance, all other factors being equal. Therefore, fast detection of light using traditional nanowire-based detectors can be challenging and inefficient.

Accordingly, improved compositions and methods are needed.

SUMMARY OF THE INVENTION

Systems, articles, and methods related to nanowire-based detectors are provided. The subject matter of the present invention involves, in some cases, interrelated products, alternative solutions to a particular problem, and/or a plurality of different uses of one or more systems and/or articles.

In one aspect, a method is described. The method can comprise, in some instances, forming a layer of a first electrically insulating material adjacent a layer of electrically superconductive material; removing a portion of the first electrically insulating material to form a first pattern of the first electrically insulating material and exposed superconductive material; removing at least a portion of the exposed electrically superconductive material to form a second pattern of electrically superconductive material which substantially corresponds to the first pattern of the first electrically insulating material; and forming a layer of electrically conductive material proximate the first electrically insulating material.

In another aspect, an article is described. The article can comprise, in some embodiments, an electrically superconductive material proximate a resonance structure, wherein the resonance structure is constructed and arranged to include at least one dimension that is resonant with electromagnetic radiation to which the article is designed to be exposed.

In one set of embodiments, the article can comprise an electrically superconductive material proximate an electrically conductive material, the electrically conductive material comprising a plurality of protrusions at least two of which form a feed gap that enhances the field of electromagnetic radiation to which the article is designed to be exposed.

The article can comprise, in some instances, a layer of electrically superconductive material in a first pattern; a layer of a first electrically insulating material positioned proximate the electrically superconductive material in a second pattern substantially corresponding to the first pattern of electrically superconductive material; a layer of a second electrically insulating material different from the first electrically insulating material and/or a layer of a semiconductor material, positioned proximate the first electrically insulating material; and a layer of electrically conductive material positioned proximate the layer of second electrically insulating material and/or the layer of semiconductor material.

In another aspect, a photon detector is described. The photon detector can comprise, in some cases, an electrically superconductive nanowire wherein the active area defined by the nanowire times the device efficiency divided by the reset time of the detector is at least about 3 microns$^2$/nanosecond.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
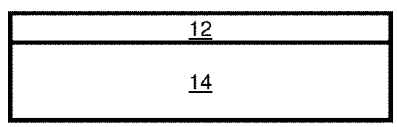
FIGS. 1A-1F include cross-sectional schematic illustrations outlining the fabrication of a nanowire sensor, according to one set of embodiments.
Figure 1D:
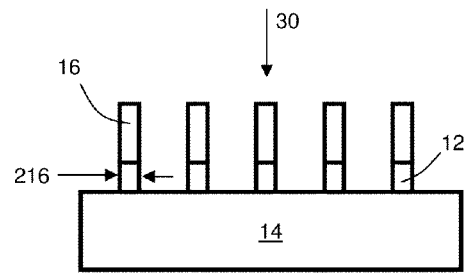
Figure 1B:
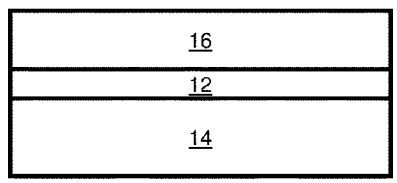
Figure 1E:
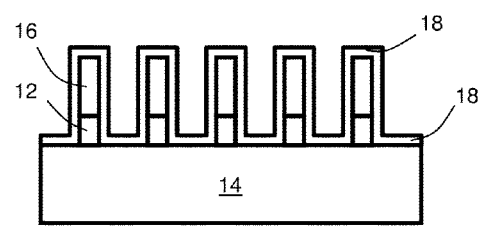
Figure 1C:
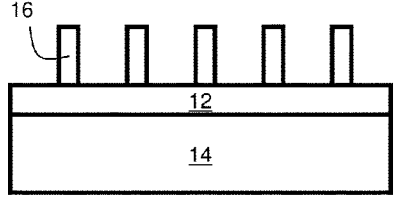

Systems, articles, and methods are provided related to nanowire-based detectors, which can be used for light detection in, for example, single-photon detectors. In one aspect, a variety of detectors are provided, for example one including an electrically superconductive nanowire or nanowires constructed and arranged to interact with photons to produce a detectable signal. In another aspect, fabrication methods are provided, including techniques to precisely reproduce patterns in subsequently formed layers of material using a relatively small number of fabrication steps. By precisely reproducing patterns in multiple material layers, one can form electrically insulating materials and electrically conductive materials in shapes such that incoming photons are redirected toward a nearby electrically superconductive materials (e.g., electrically superconductive nanowire(s)). For example, one or more resonance structures (e.g., comprising an electrically insulating material), which can trap electromagnetic radiation within its boundaries, can be positioned proximate the nanowire(s). The resonance structure can include, at its boundaries, electrically conductive material positioned proximate the electrically superconductive nanowire such that light that would otherwise be transmitted through the sensor is redirected toward the nanowire(s) and detected. In addition, electrically conductive material can be positioned proximate the electrically superconductive nanowire (e.g. at the aperture of the resonant structure), such that light is directed by scattering from this structure into the nanowire.

The ability to redirect photons that would otherwise not interact with a nanowire(s) toward the nanowire(s) can allow one to arrange the nanowire such that it collects light from a relatively large surface area without substantially increasing the length of the nanowire. Large surface area coverage can be achieved, for example, by increasing the spacing between substantially equally spaced elongated sections of a single nanowire (e.g., in the case of a serpentine nanowire) or multiple nanowires. Photon detectors covering relatively large areas can be capable of achieving enhanced performance, including, for example, relatively high efficiencies and/or fast reset times.

The systems, articles, and methods described herein can be used in a variety of applications, for example, to produce highly sensitive photon counters. Such counters can be useful in the production of cryptographic devices (e.g., fiber-based quantum key distribution systems), photon counting optical communication systems, and the like. In some cases, the systems, articles, and methods can be used to produce or as part of a linear optical quantum computer. The embodiments described herein can also be used in the evaluation of transistor elements in large-scale integrated circuits, as the elements emit photons; characterization of the photons and their time of arrival can be used to understand the operation of the circuit, for example. The embodiments described herein may also find use in underwater communications, inter-planetary communications, or any communication system in which ultra-long-range or absorbing or scattering media produce relatively high link losses.

In some cases, the methods described herein can be used to fabricate superconducting nanowire single-photon detectors (SNSPDs). The basic functionality of SNSPDs are described, for example, in "Electrothermal feedback in superconducting nanowire single-photon detectors," Andrew J. Kerman, Joel K. W. Yang, Richard J. Molnar, Eric A. Dauler, and Karl K. Berggren, Physical Review B 79, 100509 (2009). Briefly, a plurality of photons can be directed toward a superconducting nanowire (e.g., an niobium nitride (NbN) nanowire). A portion of the photons can be absorbed by the nanowire, to which a bias current is applied. When an incident photon is absorbed by the nanowire with a bias current slightly below the critical current of the superconducting nanowire, a resistive region called hot-spot is generated, which can yield a detectable voltage pulse.

In many systems and devices employing photon-detecting nanowires (e.g., where the nanowire is being used in an SNSPD), it can be beneficial to design the nanowire such that it is narrower than 100 nm and as thin as 4 to 6 nm to allow for effective photon detection. In nanowires used to detect infrared radiation, for example, these nanowire widths are an order of magnitude narrower than the Rayleigh diffraction limit of the infrared radiation. Therefore, it is often beneficial to design the nanowire (or a plurality of nanowires) such that they cover a relatively large amount of area. Covering a relatively large area to facilitate efficient coupling, however, can require longer nanowire(s). The use of longer nanowire(s) can result in a slower speed because the speed of the detector is limited by its kinetic inductance, which is proportional to the length of the nanowire. As mentioned above, the inventors have discovered, within the context of the invention, that the ability to precisely reproduce patterns in multiple material layers can allow one to form a structure including a superconductive nanowire(s), electrically insulating material, and/or an electrically conducting material such that incoming photons are redirected from multiple locations toward the superconductive nanowire. This can allow one to increase the area covered by the nanowire, thereby increasing system efficiency without sacrificing detection speed.

FIGS. 1A-1F include exemplary schematic illustrations outlining a method of fabricating an article, according to one set of embodiments. In FIG. 1A, a layer of electrically superconductive material 12 is positioned proximate substrate 14. As used herein, two materials (e.g., layers of materials) are "proximate" when they are sufficiently close to retain their desired functionality. For example, an electrically insulating material might be proximate an electrically conductive material as long as their positions are sufficiently close that the electrically insulating material can inhibit the transfer of electrons to and/or from the electrically conductive material. In some embodiments, two materials can be proximate when they are positioned in direct contact with each other. In some instances, two materials can be proximate while one or more other materials are positioned between them. Accordingly, while electrically superconductive material 12 is shown as being positioned directly on substrate 14 in FIG. 1A, it should be understood that, in other embodiments, the electrically superconductive material 12 and the substrate 14 can remain proximate while one or more other layers (e.g., an adhesion promoter) is positioned between them.

The term "electrically superconductive material," is given its accepted meaning in the art, i.e., a material that is capable of conducting electricity in the substantial absence of electrical resistance below a threshold temperature. One of ordinary skill in the art would be able to identify electrically superconductive materials suitable for use with the invention.

The electrically superconductive material can be formed using any suitable method. In some cases, the electrically superconductive material can be provided as an as-grown film on a substrate. In some instances, the electrically superconductive material can be formed via electron-beam deposition or sputter deposition. In some embodiments, a relatively thin layer of electrically superconductive material can be provided. For example, in some embodiments, the layer of electrically superconductive material can have an average thickness of less than about 20 nm, less than about 10 nm, less than about 5 nm, between about 2 nm and about 20 nm, between about 2 nm and about 10 nm, or between about 4 nm and about 6 nm. One of ordinary skill in the art would be capable of measuring the thicknesses (and calculating average thicknesses) of thin films using, for example, a transmission-electron microscope.

A variety of electrically superconductive materials are suitable for use in the embodiments described herein. For example, in some embodiments, the electrically superconductive material can comprise niobium (Nb). In some cases the electrically superconductive material can be niobium nitride (NbN), niobium metal, niobium titanium nitride (Nb-TiN), or a combination of these materials. In some cases, the electrically superconductive material can be patterned to form a nanowire, as discussed in more detail below. The electrically superconductive material (e.g., in the form of a nanowire) can be used, in some embodiments, as a medium in or on which photons are absorbed (e.g., when used in a photon detector).

A variety of substrates are suitable for use in the systems, articles, and methods described herein. In many embodiments, the substrate is formed of an electrically insulating material. The substrate can be capable, in some instances, of transmitting at least a portion of at least one wavelength of electromagnetic radiation. For example, the substrate might be substantially transparent to at least one wavelength of electromagnetic radiation (e.g., at least one wavelength, as measured in a vacuum, of infrared radiation). In embodiments where the nanowire is constructed and arranged to detect photons, the substrate can be formed of a material that is capable of transmitting at least a portion of the photons of a predetermined wavelength that the detector is constructed and arranged to detect. The use of a transparent substrate can allow one to employ opaque materials (e.g., metals) on the side of the detector opposite the substrate while maintaining a pathway by which photons can reach and be absorbed by the nanowire. Examples of materials suitable for use in the substrate include, but are not limited to, sapphire, magnesium oxide, and silicon dioxide.

A first layer of electrically insulating material can be formed, in some cases, proximate the electrically superconductive material. For example, in the set of embodiments illustrated in FIG. 1B, first electrically insulating material 16 is positioned proximate electrically superconductive material 12. While first electrically insulating material 16 is illustrated as being positioned directly on electrically superconductive material 12 in FIG. 1B, it should be understood that additional layers can be positioned between the two materials, in some cases, while maintaining proximity between the electrically insulating material and the electrically superconductive material.

The first electrically insulating material can comprise any suitable electrical insulator. In some embodiments, the first electrically insulating material can include a photoresist which can, in some embodiments, form a structural portion of the final product (e.g., a photon detector). In some cases, the first electrically insulating material can include an inorganic material (e.g., an inorganic photoresist). In some embodiments the first electrically insulating material can comprise an oxide. For example, in some cases, the first electrically insulating material can comprise hydrogen silesquioxane. In some embodiments, the first electrically insulating material can comprise an evaporated or sputtered silicon oxide.

The first electrically insulating material can be formed using any suitable method. In some cases, the electrically insulating material can be formed via spin coating. Spin-coating can be particularly suitable when, for example, the first electrically insulating material comprises a photoresist. Spin coating can be particularly advantageous, in some cases, due to the ease of deposition and/or the relatively thick layers that can be deposited. In other cases, the electrically insulating material can be formed by deposition (e.g., via silicon oxide evaporation or sputtering).

The first electrically insulating material can have any suitable thickness. In some cases, the first electrically insulating material can be relatively thick, in comparison to the electrically superconductive material. For example, in some cases, the first electrically insulating material can have an average thickness (e.g., as deposited and/or in the final article) of at least about 50 nm, at least about 100 nm, at least about 200 nm, at least about 300 nm, at least about 400 nm, at least about 500 nm, between about 10 nm and about 150 nm, between about 10 nm and about 300 nm, or between about 100 nm and about 500 nm.

At least a portion of the first electrically insulating material can be removed, in some cases. The removal of the first electrically insulating material can result in the formation of a pattern of first electrically insulating material (corresponding to the portions of the first electrically insulating material that were not completely removed), and a pattern of exposed electrically superconductive material. For example, in FIG. 1C, a portion of the first electrically insulating material 16 has been removed to form a pattern of exposed superconductive material and a pattern of first electrically insulating material (also indicated as 16 in FIG. 1C).

The first electrically insulating material can be removed using any suitable method. For example, in some embodiments, the first electrically insulating material can be removed by etching. Examples of suitable etching techniques can include, for example, scanning electron beam lithography (which can be used, for example, to toughen a material such as a photoresist, and can be followed by liquid development). In some embodiments, the first electrically insulating material can be removed via reactive ion etching (e.g., using $CF_4$ and $CHF_3$).

In some cases, at least a portion of the exposed electrically superconductive material can be removed to form a pattern of electrically superconductive material. Removal of at least a portion of the exposed electrically superconductive material might also comprise exposing a material over which the electrically superconductive material is positioned. This can result in the formation of a pattern of exposed substrate or other layers positioned underneath the electrically superconductive material. The pattern of electrically superconductive material can, in some cases, correspond to the pattern of first electrically insulating material. For example, in FIG. 1D, a portion of the exposed electrically superconductive material in FIG. 1C has been removed to form a second pattern of electrically superconductive material, which substantially corresponds to the pattern of first electrically insulating material.

The electrically superconductive material can be removed using any suitable method. For example, in some embodiments, the electrically superconductive material can be removed via etching. Suitable etching techniques can include, for example, dry etching (e.g., reactive ion etching such as deep reactive ion etching using, for example, $Cl_2$ or $SF_6$).

In some cases, the first electrically insulating material (e.g., the portions that remain after the removal of at least some of the first electrically insulating material) can be used as a mask (e.g., an etch mask) to remove a portion of the electrically superconductive material. In some cases, a portion of the electrically superconductive material can be removed without the substantial use of any mask (e.g., an etch mask such as a photoresist) other than the first electrically insulating material. For example, in FIG. 1C, the remaining portions of first electrically insulating material 16 serve as an etch mask during the removal of electrically superconductive material 12, such that the portions of the electrically superconductive material 12 covered by first electrically insulating material 16 are not removed during the etching step. Using the first electrically insulating material as a mask when removing the electrically superconductive material can provide several advantages. For example, using the first electrically insulating material as a mask can allow one to very accurately reproduce the first electrically insulating material pattern within the electrically superconductive material (e.g., relative to the accuracy that could be achieved using a traditional photolithography alignment process). In addition, reproduction of the first electrically insulating material pattern within the electrically superconductive material can be achieved relatively quickly by using the first electrically insulating material as an etch mask.

In some embodiments (e.g., when the first electrically insulating material is used as a mask when removing a portion of the electrically superconductive material), the pattern of the first electrically insulating material and the pattern of the electrically superconductive material can be similar to within a very tight tolerance. For example, in some embodiments, at least about 95%, at least about 99%, at least about 99.9%, or at least about 99.99% of the patterns formed by the first electrically insulating material and the electrically superconductive material overlap when viewed in a common direction (e.g., when viewed in the direction indicated by arrow 30 in FIG. 1D).

Portions of the first electrically insulating material and/or the electrically superconductive material can be removed to form any suitable pattern. In some embodiments, a portion of the electrically superconductive material can be removed such that the remaining portions of the electrically superconductive material form one or more nanowires. The term "nanowire," as used herein, is used to refer to an elongated structure that, at any point along its longitudinal axis, has at least one cross-sectional dimension (as measured perpendicular to the longitudinal axis) of less than 1 micron. In some embodiments, a nanowire can have, at any point along its longitudinal axis, two orthogonal cross-sectional dimensions of less than 1 micron. An "elongated" structure is a structure for which, at any point along the longitudinal axis of the structure, the ratio of the length of the structure to the largest cross-sectional dimension perpendicular to the length at that point is greater than 2:1. This ratio is termed the "aspect ratio." In some embodiments, the nanowire can include an aspect ratio greater than about 2:1, greater than about 5:1, greater than about 10:1, greater than about 100:1, or greater than about 1000:1.

The nanowire can have any suitable width. Generally, the width of the nanowire at a given point along the longitudinal axis of the nanowire is measured as the largest cross-sectional dimension of the nanowire parallel to the plane of the material on which the nanowire is positioned and perpendicular to the longitudinal axis of the nanowire. For example, in cases where the nanowire is positioned on or proximate a substrate, the width of the nanowire is generally measured in a direction parallel to the plane defined by the substrate. For example, the widths of the nanowires illustrated in FIG. 1D and FIGS. 2A-2D are indicated by dimension 216. In some embodiments, the maximum width of the nanowire (i.e., the maximum of the widths along the longitudinal axis of the nanowire) can be less than about 500 nm, less than about 250 nm, less than about 100 nm, less than about 25 nm, between about 10 nm and about 500 nm, between about 25 nm and about 500 nm, between about 50 nm and about 250 nm, or between about 75 nm and about 125 nm. In some instances, the average width of the nanowire (i.e., the average of the widths as measured along the length of the nanowire) can be less than about 500 nm, less than about 250 nm, less than about 100 nm, between about 25 nm and about 500 nm, between about 50 nm and about 250 nm, or between about 75 nm and about 125 nm.

In some embodiments, the nanowire can include a relatively consistent width. For example, the width of a nanowire can be within about 20%, within about 10%, within about 5%, or within about 1% of the average width of the nanowire over at least about 50%, at least about 75%, at least about 90%, at least about 95%, or at least about 99% of the length of the longitudinal axis of the nanowire.

The width of the nanowire (e.g., the maximum width, the average width) can be defined by the removal of a portion of the material forming the nanowire (e.g., the electrically superconductive material), in some cases (e.g., in the embodiments illustrated in FIGS. 1A-1F). For example, when etching is used to remove a portion of electrically superconductive material to for the nanowire, the nanowire width can be defined by the pattern of the etch.

In some embodiments, the nanowire can include a plurality of elongated portions (whether straight or curved) that can be substantially equally spaced. In some cases, the substantially equally spaced elongated portions (whether straight or curved) can be separated by distances (as measured along a straight line perpendicular to the lengths of and/or tangents of each of the two elongated portions) that are within about 90% of the average distance between the two portions along at least about 90% of the length of the portions. In some embodiments, the distances between the two substantially equally spaced elongated portions can be within about 90%, within about 95%, or within about 99% of the average distance between the two portions along at least about 90%, along at least about 95%, or along at least about 99% of the lengths of the portions, wherein the elongated portions have aspect ratios of greater than about 5:1, greater than about 10:1, greater than about 100:1, or greater than about 1000:1. A nanowire can include, in some embodiments, at least 3, at least 4, at least 5, or more elongated portions meeting the criteria outlined above.

Figure 2A:
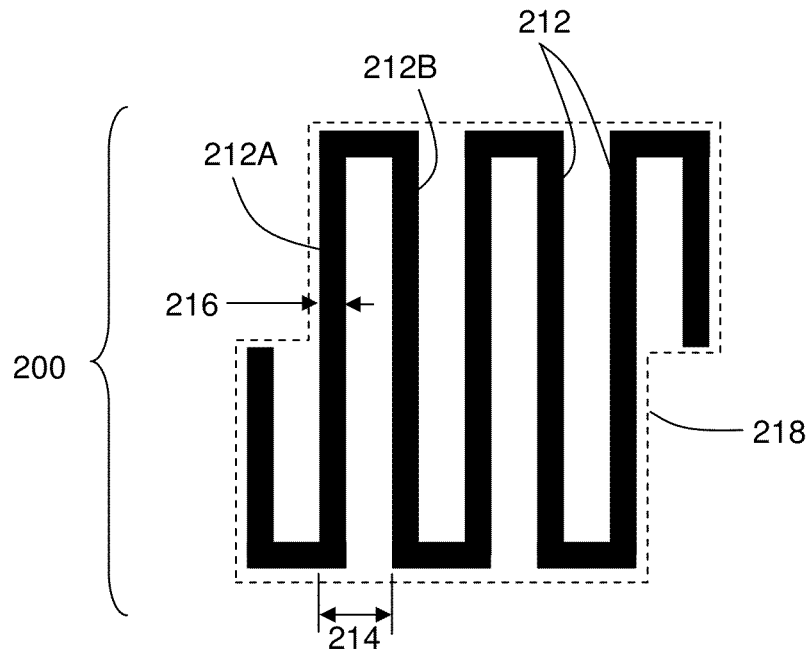
FIGS. 2A-2D include exemplary schematic illustrations of nanowires.
Figure 2B:
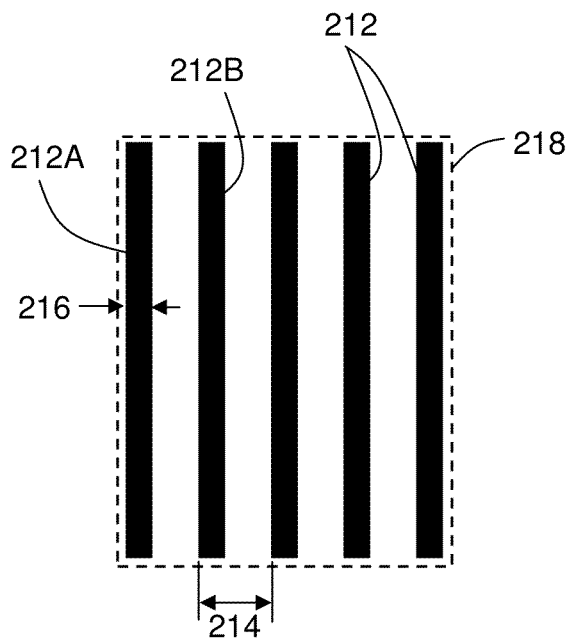

In some cases, the plurality of elongated, substantially equally spaced portions of the electrically superconductive material can be substantially parallel. The plurality of elongated portions can be arranged, in some embodiments, in a side-by-side manner (i.e., a straight line perpendicular to the lengths and/or tangents of the elongated portions intersects each of the plurality of elongated portions). One such example is illustrated in FIGS. 2A-2B. The plurality of elongated portions can be connected by portions of electrically superconductive material proximate the ends of the elongated portions to form a serpentine nanowire. The serpentine nanowire can include a regularly repeating pattern of turns that form multiple portions (which can be substantially parallel) spaced at a regular interval.

In the set of embodiments illustrated in FIGS. 1A-1F, the electrically superconductive material that remains on the substrate forms a serpentine nanowire 200, as shown in FIG. 2A. The serpentine nanowire in the set of embodiments illustrated in FIG. 2A includes a plurality of substantially parallel portions 212 arranged in a side-by-side manner and separated at regular intervals to define a period. As used herein, the "period" of a plurality of substantially equally spaced elongated portions refers to the average distance between corresponding points of adjacent portions. For example, when the elongated portions comprise substantially parallel portions, the period refers to the average distance between corresponding points of adjacent substantially parallel portions, which is measured as the distance between a point on a first substantially parallel portion of the nanowire to the corresponding point on an adjacent substantially parallel portion of the nanowire. As shown in FIG. 2A, one distance between corresponding points of adjacent substantially parallel portions 212A and 212B corresponds to the distance between the left edges of those substantially parallel portions, as indicated by dimension 214.

While FIG. 2A illustrates one set of embodiments in which a single nanowire is formed in a serpentine pattern, it should be understood that other patterns can be formed. For example, a plurality of nanowires can be formed. In some embodiments, a plurality of nanowires, not monolithically integrally with each other (i.e., connected via the same electrically superconductive material during a single formation step), can be formed as a series of substantially parallel nanowires arranged in a side-by-side manner. In such cases, the nanowires can be connected, in series or in parallel, using a different electrically superconductive material (e.g., formed on the substrate), an electrically conductive material (e.g., metals such as gold, silver, aluminum, titanium, or a combination of two or more of these which can be, for example, formed on the substrate), and/or using a off-substrate circuitry. In cases where multiple substantially parallel nanowires are used, the period of the plurality of nanowires is defined in a similar fashion as described above with relation to the serpentine nanowire. For example, in FIG. 2B, portions of the electrically superconductive material have been removed to form five substantially parallel nanowires arranged in a side-by-side manner. Similar to the set of embodiments described in FIG. 2A, the period between adjacent nanowires is indicated by dimension 214.

Figure 2C:
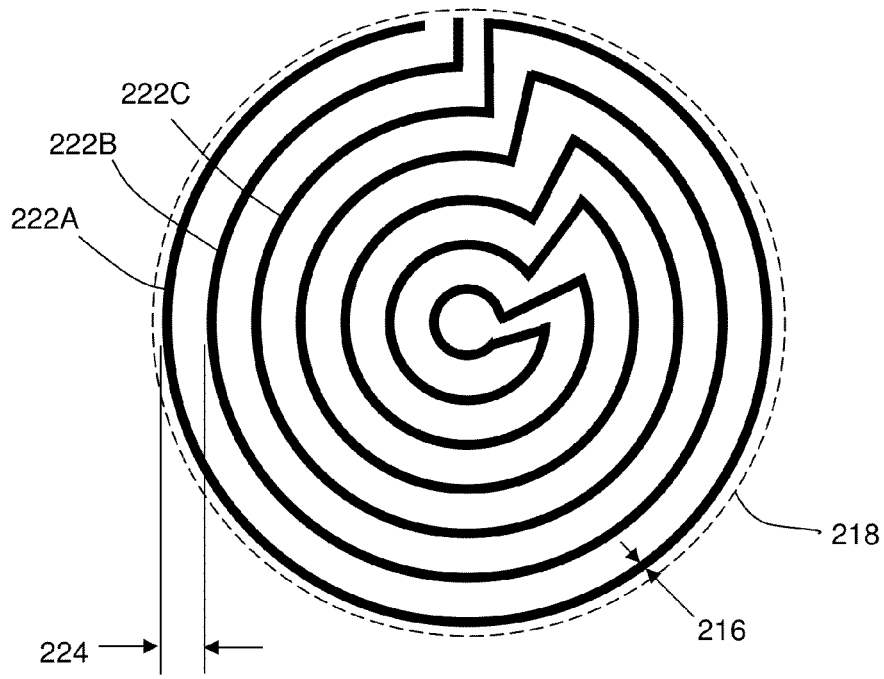
Figure 2D:
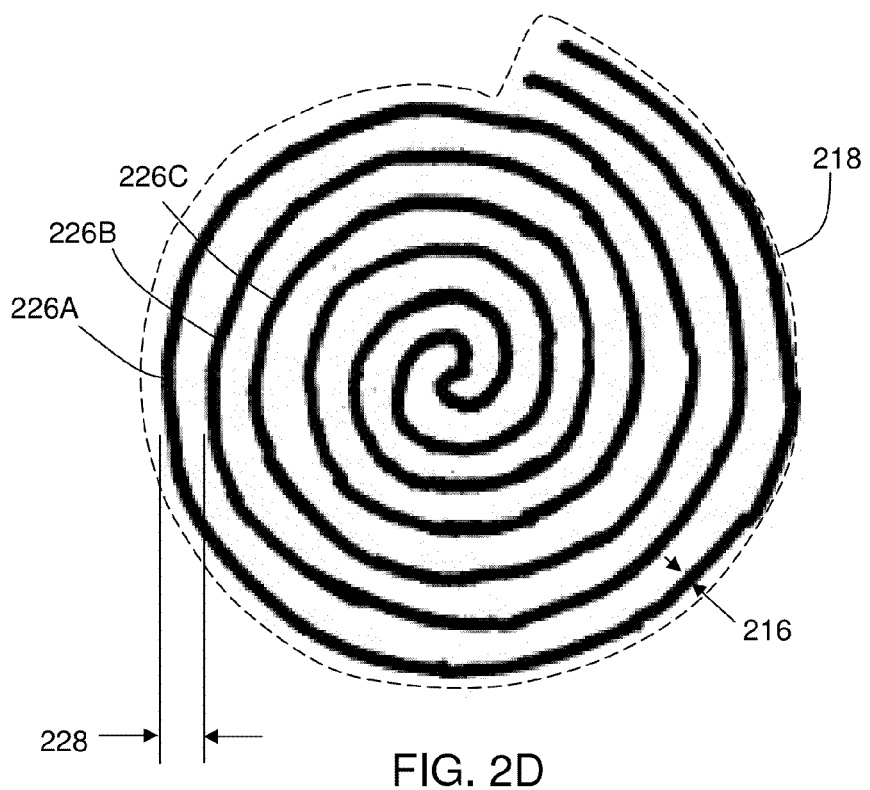

In still other embodiments, the plurality of elongated, substantially equally spaced portions of electrically superconductive material can include one or more curves. For example, the plurality of elongated, substantially equally spaced portions can be substantially concentric, in some cases. FIG. 2C includes a schematic illustration of one such set of embodiments. In FIG. 2C, portions 222A, 222B, and 222C are substantially equally spaced and define period 224. FIG. 2D includes another set of embodiments in which the plurality of elongated, substantially equally spaced portions are curved. In FIG. 2D, portions of the nanowire are formed in the shape of a spiral, with portions 226A, 226B, and 226C substantially equally spaced to define period 228.

In some embodiments, the nanowire (or plurality of nanowires) can include a relatively large period. For example, the period between elongated substantially equally spaced portions of the nanowire can be at least about 250 nm, at least about 500 nm, at least about 600 nm, between about 250 nm and about 800 nm, between about 500 nm and about 700 nm, or between about 550 nm and about 650 nm, in some embodiments. In some cases, the period can depend on the index of refraction of the substrate material and/or the wavelength of electromagnetic radiation to which the detector is designed to be exposed. For example, as the wavelength (as measured in a vacuum) of the detected electromagnetic radiation is increased, it can be desirable to increase the period. In some cases, as the index of refraction of the substrate material is increased, it may be desirable to decrease the period. In some embodiments, the period of substantially equally spaced portions of the nanowire can be between about $0.45(\lambda/n)$ and about $0.9(\lambda/n)$, between about $0.55(\lambda/n)$ and about $0.8(\lambda/n)$, between about $0.60 (\lambda/n)$ and about $0.75 (\lambda/n)$, or between about $0.66(\lambda/n)$ and about $0.69(\lambda/n)$, wherein $\lambda$ is the wavelength of electromagnetic radiation (as measured in a vacuum) to which the detector is constructed and arranged to be exposed, and n is the index of refraction of the substrate material. Nanowires with relatively large periods can be useful in forming photon detectors with relatively large surface areas, while maintaining reasonable efficiencies and speeds.

In some cases, a layer of a second electrically insulating material can be positioned proximate the layer of first electrically insulating material. The second electrically insulating material can be, for example, formed after the first electrically insulating material. In some embodiments, the second electrically insulating material can be positioned such that it is in direct contact with first electrically insulating material. For example in FIG. 1E, some of the second electrically insulating material 18 is in direct contact with first electrically insulating material 16.

The second electrically insulating material can, in some cases, be formed proximate the first electrically insulating material after the removal of a portion of the first electrically insulating material and/or the superconductive material. For example, in FIG. 1E, second electrically insulating material 18 is positioned proximate first electrically insulating material 16, having been formed after the removal of a portion of first electrically insulating material 16 and electrically superconductive material 12.

The second electrically insulating material can include any suitable material. In some embodiments, the first and second electrically insulating materials include the same materials. In other cases, the second electrically insulating material can include a different chemical composition than the first electrically insulating material. Exemplary materials that can be used in the second electrically insulating material include, but are not limited to, silicon dioxide, $SiO_x$ and hydrogen silesquioxane. In some embodiments, a semiconductor material (e.g., silicon) can be used in place of the second electrically insulating material. Accordingly, in every location herein where a second electrically insulating material is discussed, a semiconductor material could be used in addition to or in place of the second electrically insulating material.

The second electrically insulating material can have any suitable thickness. In some embodiments, the second electrically material can have an average thickness of less than about 25 nm, less than about 10 nm, between about 1 nm and about 25 nm, or between about 4 nm and about 8 nm.

The formation of the second electrically insulating material can serve a variety of functions. In some embodiments, the formation of the second electrically insulating material can electrically isolate the electrically superconductive material from portions of electrically conductive material (described in more detail below). The second electrically insulating material can promote the adhesion of subsequent layers that are deposited over the first and second electrically insulating materials. In some instances, the formation of the second electrically insulating material might plug pinholes or other defects in the electrically insulating material formed below.

Figure 1F:
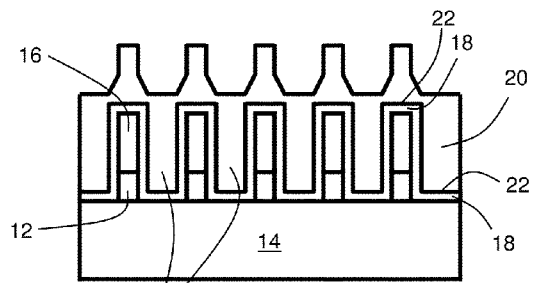

One or more electrically conductive materials can be positioned proximate the first and/or second electrically insulating materials. As described in more detail below, the electrically conductive material can be used, for example, to reflect and/or to re-direct incident photons toward the electrically superconductive material. In FIG. 1F, an electrically conductive material 20 is positioned proximate second electrically insulating material 18 and first electrically insulating material 16. In some embodiments, the electrically conductive material can be positioned such that it is in direct contact with the second electrically insulating material. For example, in FIG. 1F, electrically conductive material 20 is positioned such that it is in direct contact with second electrically insulating material 18.

A variety of materials can be used as the electrically conductive material. In some embodiments, the electrically conductive material can include a metal. The metal can be, for example, a substantially pure metal or an alloy. The electrically conductive material can include, for example, gold, silver, aluminum, platinum, or a combination of two or more of these.

In some embodiments, the electrically conductive material can be formed proximate the first and/or second electrically insulating materials (e.g., such that it is in direct contact with the second electrically insulating material). The electrically conductive material can be formed using any suitable method. For example, in some cases, the electrically conductive material can be formed by deposition (e.g., electron-beam deposition, sputter deposition, and the like).

The electrically conductive material can include a plurality of protrusions positioned between the substantially equally spaced portions of the electrically superconductive material and/or the first electrically insulating material. The protrusions of electrically conductive material can be formed, for example, as the electrically conductive material is deposited in the voids left after the removal of a portion of the first electrically insulating material and/or the electrically superconductive material. For example, in FIG. 1F, electrically conductive material 20 includes four protrusions 32 positioned between portions of first electrically insulating material 16. The plurality of protrusions of electrically conductive material can be in the shape of a grating proximate the electrically superconductive material. The grating can act as an optical antenna, redirecting incident photons toward the electrically superconductive material, as discussed below.

The protrusions of electrically conductive material can be spaced at regular intervals, defining a period, which is measured in a similar manner as that described above with relation to the plurality of substantially equally spaced portions of superconductive material. In some embodiments, the period of the protrusions of electrically conductive material can be substantially equal to the period of the substantially equally spaced portions of the superconductive material. In some cases, the period of the protrusions of the electrically conductive material can be smaller than the wavelength (as measured in a vacuum) of electromagnetic radiation the device is designed to detect. For example, the period of the protrusions of electrically conductive material can be smaller than a wavelength of infrared radiation.

The electrically conductive material can have any suitable thickness. In some embodiments, the electrically conductive material can have an average thickness of at least about 50 nm, at least about 100 nm, at least about 300 nm, between about 50 nm and about 500 nm, or between about 250 nm and about 350 nm.

In some embodiments, an adhesion promoter can be positioned between the electrically conductive material and the first and/or second insulating material. For example, the adhesion promoter can be formed over an electrically insulating material (e.g., the first or second electrically insulating material) before forming the electrically conductive material. For example, as illustrated in FIG. 1F, adhesion promoter 22 has been formed over second electrically insulating material 18. In FIG. 1F, adhesion promoter 22 is indicated by the line between second electrically insulating material 18 and electrically conductive material 20 for purposes of clarity. The adhesion promoter can comprise any suitable material. In some embodiments, the adhesion promoter comprises a metal. For example, in some cases, the adhesion promoter can contain titanium. In some embodiments, a relatively thin layer of adhesion promoter can be used. For example, in some cases, the thickness of the adhesion promoter layer can be less than about 10 nm, less than about 5 nm, less than about 3 nm, between about 1 nm and about 10 nm, or between about 2 nm and about 4 nm As mentioned above, the systems, articles, and methods described herein can be used to produce photon detectors. The photon detectors described herein can be constructed and arranged to detect wavelengths of electromagnetic radiation that fall within specified ranges. For example, in some cases, a photon detector can be constructed and arranged to detect infrared electromagnetic radiation (e.g., infrared electromagnetic radiation with a wavelength between about 750 nm and about 10 micrometers, as measured in a vacuum). In some cases, the photon detector can be constructed and arranged to detect visible light (i.e., wavelengths of between about 380 nm and about 750 nm, as measured in a vacuum). In some cases, the photon detector can be constructed and arranged such that, during operation, it can be tuned to detect a predetermined range of wavelengths of electromagnetic radiation (e.g., a range with a width of less than about 1000 nm, less than about 100 nm, less than about 10 nm, between about 0.1 nm and about 1000 nm, between about 0.1 nm and about 100 nm, between about 0.1 nm and about 10 nm, or between about 0.1 nm and about 1 nm, each range as measured in a vacuum).

Figure 3A:
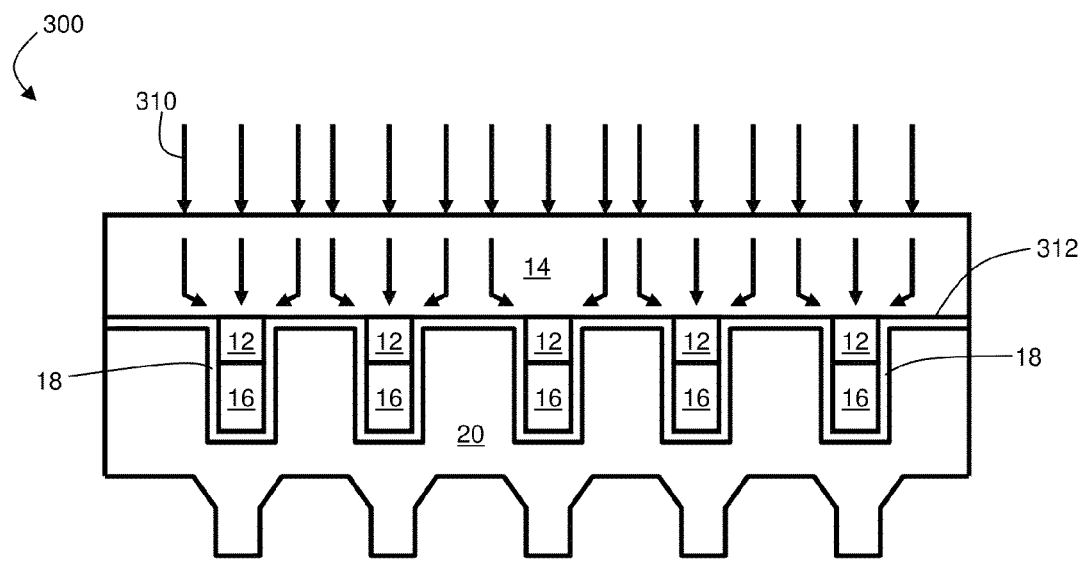
FIGS. 3A-3B include, according to some embodiments, cross-sectional schematic illustrations outlining the operation of a nanowire sensor.
Figure 3B:
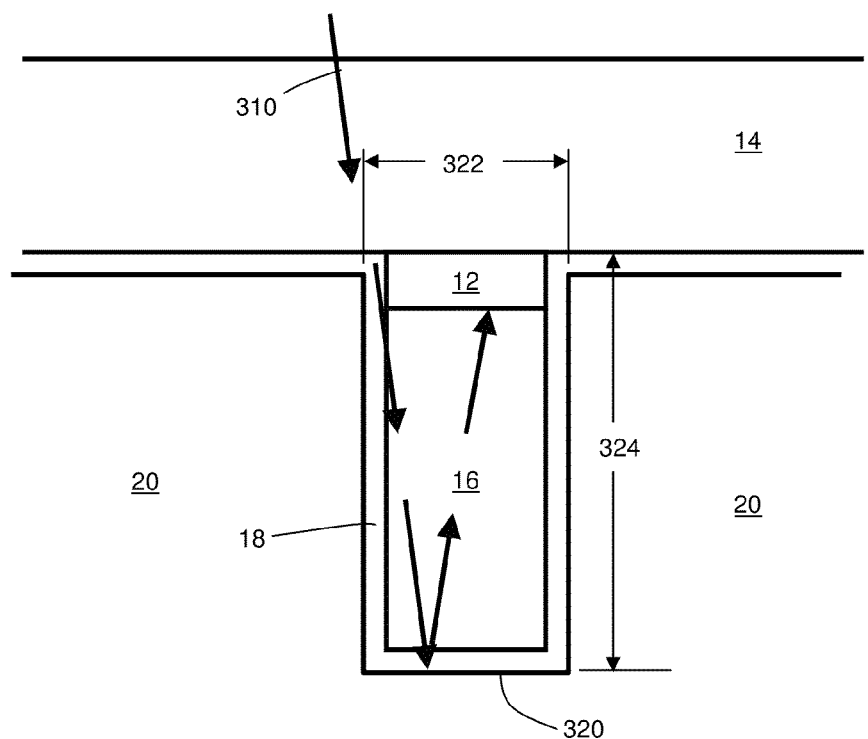

FIGS. 3A-3B include schematic illustrations outlining the operation of photon detector 300, according to one set of embodiments. In FIG. 3A, electromagnetic radiation, indicated by arrows 310, is directed toward and transmitted through substrate 14. As the electromagnetic radiation approaches interface 312 between the substrate and the second electrically insulating material/electrically conductive material, the radiation directed toward the spaces between the electrically superconductive material 12 can be redirected toward the electrically superconductive material. In some embodiments, the presence of the grating of electrically conductive material can behave as a set of optical antennae, redirecting the electromagnetic radiation toward the electrically superconductive nanowire. Not wishing to be bound by any particular theory, the grating of electrically conductive material might act as an arrayed metal-insulator-metal waveguide. The redirection of electromagnetic radiation can allows one to employ a relatively large period between portions of electrically superconductive material 12 while maintaining a relatively high degree of interaction between the incident electromagnetic radiation 310 and the electrically superconductive material (e.g., the electrically superconductive nanowire).

A feed gap can, in some embodiments, be positioned proximate the electrically superconductive material (e.g., the superconductive nanowire). For example, the protrusions of electrically conductive material can form a feed gap. One of ordinary skill in the art would be familiar with the concept of a feed gap. Briefly, the presence of the feed gap can locally enhance the electromagnetic field produced upon exposing the detector to electromagnetic radiation. The presence of the feed gap can enhance the redirection of electromagnetic radiation from areas between the electrically superconductive material toward the electrically superconductive material, leading to an increase in the percentage of incident electromagnetic radiation that is detected by the system. In the set of embodiments illustrated in FIG. 3B, electrically conductive material 20 forms feed gap 322 between adjacent protrusions.

The electrically conductive material can, in some embodiments, reflect at least a portion of the incident electromagnetic radiation that might otherwise be transmitted through the device. FIG. 3B includes a magnified cross-sectional schematic illustration of a segment of the electrically superconductive nanowire illustrated in FIG. 3A. In FIG. 3B, incident electromagnetic radiation (indicated by the arrows) is transmitted into first electrically insulating material 16. Upon reaching interface 320 between the second electrically insulating material 18 and electrically conductive material 20 (or between the first electrically insulating material 16 and electrically conductive material 20, if the second electrically insulating material is absent), the electromagnetic radiation is reflected back toward the electrically superconductive nanowire, at which point it can be detected. The reflection of electromagnetic radiation toward the electrically superconductive nanowire can increase the efficiency of the detector.

In some embodiments, a resonance structure can be positioned proximate the electrically superconductive material (e.g., the superconductive nanowire). The resonance structure can include, in some cases, the first electrically insulating material. The resonance structure can include at least one cross sectional dimension (e.g., a cross-sectional dimension substantially perpendicular to the plane defined by the electrically superconductive material) selected such that desirable interference between photons is achieved within the resonance structure. For example, the resonance structure might be designed such that it includes at least one cross sectional dimension that is between about 0.15 and about 0.35, between about 0.2 and about 0.3, or between 0.23 and about 0.27 times the effective wavelength of the electromagnetic radiation within the resonance structure to which the electrically superconductive material is designed to be exposed. In some embodiments, the resonance structure might be designed such that it includes at least one cross sectional dimension that is substantially equal to about one fourth of the effective wavelength of the electromagnetic radiation within the resonance structure to which the electrically superconductive material is designed to be exposed. One of ordinary skill in the art would be capable of calculating the effective wavelength of electromagnetic radiation within a structure based on the wavelength of the electromagnetic radiation in a vacuum given the indices of refraction of the materials within the structure and the geometry of the structure using, for example, a finite element simulator such as Comsol Multiphysics®. In such embodiments, electromagnetic radiation that enters the resonance structure through a first boundary can be reflected by an opposing boundary and return to the boundary through which it entered the resonance structure to, for example, destructively interfere with incident electromagnetic radiation.

As a specific example, in embodiments in which the electrically superconductive material is constructed and arranged to detect infrared radiation with a wavelength of, for example, 1550 nm (as measured in a vacuum), the detector can be constructed and arranged such that the effective wavelength of the infrared radiation within the cavity is about 800 nm and one cross-sectional dimension of the resonance structure is about 200 nm. In the set of embodiments illustrated in FIG. 3B, the thicknesses of first electrically insulating material 16 and second electrically insulating material 18 (as well as any optional adhesion promoter) could be chosen such that dimension 324 is equal to about one fourth of the effective wavelength of incident electromagnetic radiation 310 within the resonance structure.

The photon detectors described herein can exhibit enhanced performance, in some embodiments. As mentioned above, the presence of the grating of electrically conductive material (which can include a feed gap) can serve to redirect electromagnetic radiation toward the electrically superconductive material. In addition, the presence of the resonance structure can serve to trap electromagnetic radiation within the system that would otherwise be transmitted through the detector. These factors can allow for the fabrication of a nanowire with a relatively large period. The relatively large distance between substantially equally spaced portions of the nanowire can allow one to cover a relatively large active area using a relatively short length of wire. As used herein, the term "active area" is defined as the area within the plane defined by the nanowire and enclosed by the imaginary lines connecting the outermost boundaries of the shape outlined by the nanowire. For example, in FIGS. 2A-2D, the active areas are defined by dotted lines 218.

The photon detectors described herein can have relatively large active areas. In some embodiments, a photon detector can have an active area of at least about 10 square microns, at least about 25 square microns, at least about 75 square microns, at least about 150 square microns, between about 10 square microns and about 250 square microns, or between about 10 square microns and about 100 square microns.

In some embodiments, a photon detector can be operated at a relatively high efficiency. As used herein, the "efficiency" of a detector is measured as the percentage of electromagnetic radiation incident on the active area of the detector that is detected by the detector. In some embodiments, a photon detector can be operated at an efficiency of at least about 20%, at least about 30%, at least about 40%, at least about 50%, at least about 75%, at least about 90%, between about 20% and about 90%, or between about 20% and about 50%.

In addition, a photon detector can operate with a relatively small reset time (i.e., the detector can operate at a relatively fast speed). As used herein, the "reset time" of a detector is measured as the time one must wait between a detection and the point at which the detector efficiency returns to at least 90% of its original efficiency.

In some embodiments, photon detectors can have relatively large active areas while being capable of achieving relatively high efficiencies and/or fast reset times. Such performance can be expressed in terms of a speed-efficiency product. The speed-efficiency product, SEP, is defined by the following equation:

$$SEP = \frac{A\eta}{\tau} \quad [1]$$

where A is the active area defined by the nanowire, $\tau$ is the reset time of the detector, and $\eta$ is the device efficiency. In some embodiments, photon detectors can be capable of achieving a speed-efficiency product of at least about 3, at least about 3.5, at least about 4, at least about 5, at least about 6, at least about 7, or at least about 8 microns$^2$/nanosecond. That is to say, in some embodiments, a photon detector can be capable of achieving such performance that the active area defined by the nanowire times the device efficiency divided by the reset time of the detector is at least about 3, at least about 3.5, at least about 4, at least about 5, at least about 6, at least about 7, or at least about 8 microns$^2$/nanosecond. In some cases, the photon detectors described herein can achieve any of the above speed-efficiency products while maintaining an efficiency of at least about 20%, at least about 30%, at least about 40%, or at least about 50%.

As noted above, a variety of materials and methods can be used to form articles (e.g., photon detectors) and systems described herein. In some cases, one or more components can be formed using MEMS-based microfabrication techniques. For example, various components can be formed from solid materials, in which various features (e.g., nanowires, gratings of electrically conductive material, layers of electrically insulating material, and the like) can be formed via micromachining, film deposition processes such as spin coating and chemical vapor deposition, laser fabrication, photolithographic techniques, etching methods including wet chemical or plasma processes, and the like.

One of ordinary skill in the art would understand how to connect the devices described herein to external devices (e.g., an RF coaxial readout, a lens coupled fiber, etc.) for use in practice. For example, electrical contacts can be made to the electrically superconductive material (e.g., the electrically superconductive nanowire) by fabricating electrically conductive contact pads connected to the ends of the electrically superconductive material. In some embodiments, the devices (e.g., photon detectors) described herein can be constructed and arranged to be used at very low temperatures (e.g., less than about 10 K, less than about 5 K, or less than about 3 K). One of ordinary skill in the art would be capable of designing the systems and articles described herein such that stable electrical communication could be made at these very low temperatures. Such methods are described, for example, in "Efficiently Coupling Light to Superconducting Nanowire Single-Photon Detectors," Xiaolong Hu, Charles W. Holzwarth, Daniele Masciarelli, Eric A. Dauler, and Karl K. Berggren, *IEEE Transactions on Applied Superconductivity* 19, pp. 336-340 (2009).

The terms "electrically insulating material," "electrically conductive material," and "semiconductor material" would be understood by those of ordinary skill in the art. In addition, one of ordinary skill in the art, given the present disclosure, would be capable of selecting materials that fall within these categories while providing the necessary function to produce the devices and performances described herein. For example, one of ordinary skill in the art would be capable of selecting a material that would be capable of providing proper electrical insulation between an electrically superconductive material and a relatively electrically conducting material in order to, for example, prevent electron transfer between those two materials. In some embodiments, an electrically conductive material can have an electrical resistivity of less than about $10^{-3}$ ohm·cm at 20° C. The electrically insulating material can have, in some instances, an electrical resistivity of greater than about $10^8$ ohm·cm at 20° C. In some instances, a semiconductor material can have an electrical resistivity of between about $10^{-3}$ and about $10^8$ ohm·cm at 20° C.

The following patent applications are incorporated herein by reference in their entirety for all purposes: U.S. Provisional Patent Application No. 61/349,510, filed May 28, 2010, and entitled "Nanowire-Based Detector."

The following examples are intended to illustrate certain embodiments of the present invention, but do not exemplify the full scope of the invention.

EXAMPLE 1

Figure 4A:
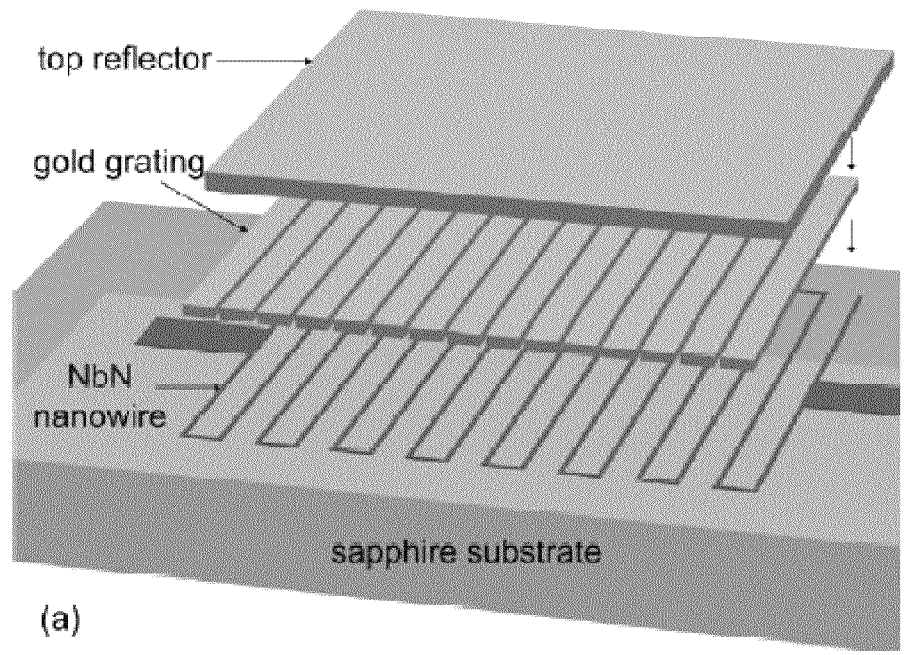
FIGS. 4A-4D include exemplary schematic illustrations of a nanowire sensor.
Figure 4B:
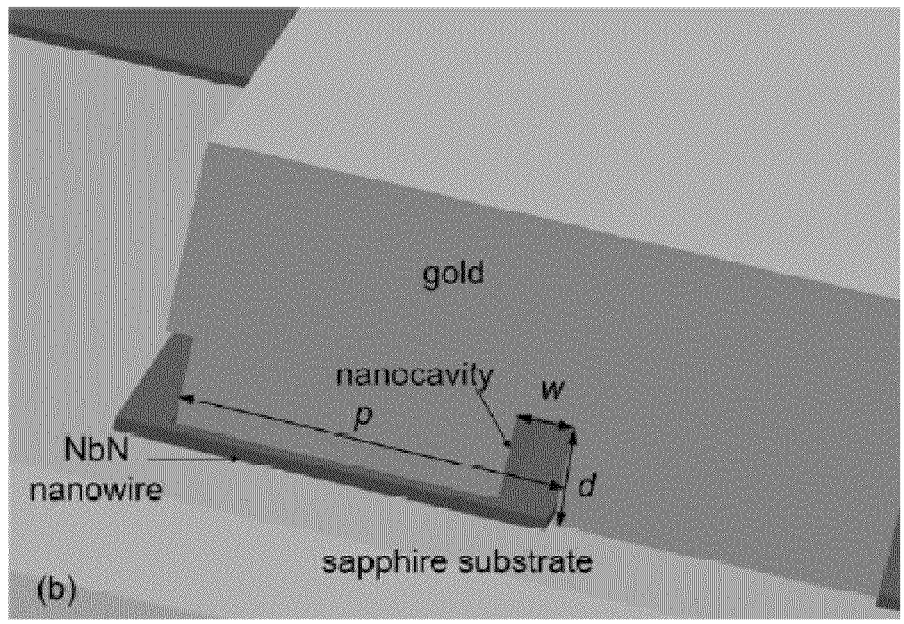
Figure 4C:
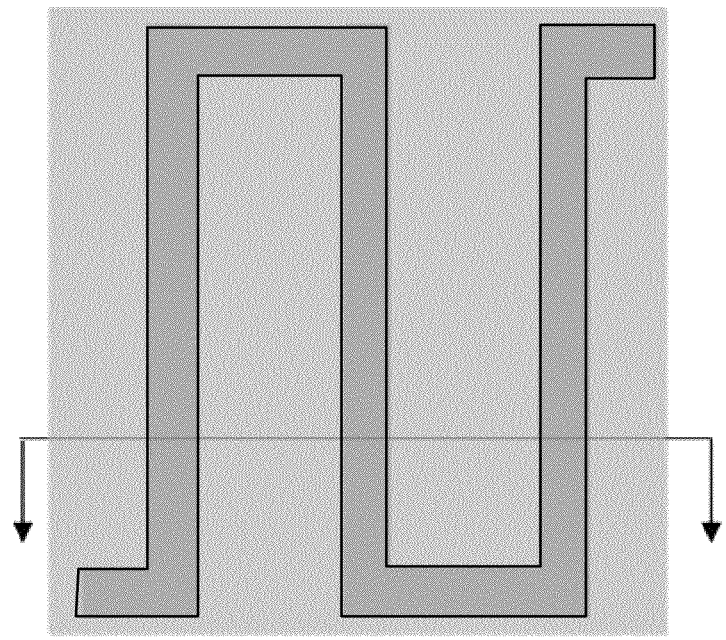
Figure 4D:
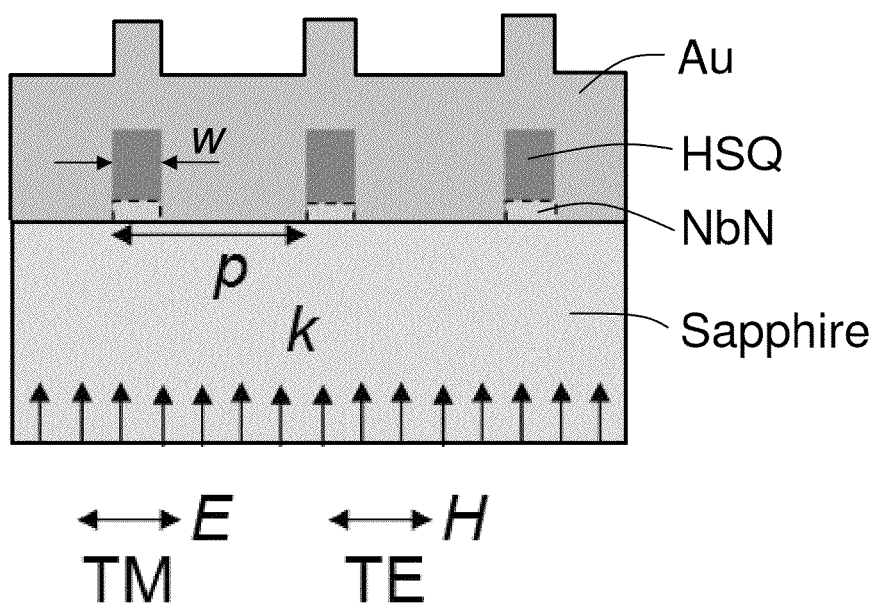

This example describes a theoretical model used to predict the performance of a superconducting nanowire single-photon detector (SNSPD). In this example, the SNSPD was constructed and arranged to detect electromagnetic radiation at an optical wavelength (as measured in a vacuum) of 1550 nm. The theoretical SNSPD (integrated with optical nano-antennae and nano-cavities) is shown schematically in FIGS. 4A-4D. The theoretical nanowire included a niobium nitride (NbN) nanowire formed in a meandering pattern on a sapphire substrate. A layer of metal subwavelength grating and a top reflector are shown over the meandering nanowire. To reduce the optical loss of this added structure on the nanowire, metals such as gold, silver, or aluminium (gold was used in this case) can be used to form a grating layer over the nanowire and nano-cavities. The subwavelength grating can behave as optical nano-antennae to collect the incident photons efficiently. The grating and the top reflector together can form nano-cavities to confine and localize the photons. FIG. 4B includes a close-up view of the system. The depth and the width of each nano-cavity slot are d and w, respectively, and the period of structure is p, which is smaller than the wavelength of interest, $\lambda$. FIG. 4C includes a top view of the detector, while FIG. 4D includes a cross-sectional schematic view. The detector is illuminated through the sapphire substrate, due to the integration of the nano-antennae and nano-cavities on top of the nanowire. As shown in FIG. 4D, the detector was illuminated using a plane wave with normal incidence, i.e., the wavevector, k, of the plane wave is perpendicular to the NbN-sapphire interface. In this example, the discussion is focused on transverse-magnetic (TM) polarization, except where it is indicated that transverse-electric (TE) polarization is being discussed. The nano-optical mechanisms mentioned above can act collectively to increase the field density in the nanowire and the effective absorption cross-section of the NbN structure for TM-polarized incident light.

The collection effect of the nano-antennae and the photonic localization effect of the nano-cavities can be explained intuitively. The idea of the nano-antennae is based on the effect that a subwavelength metal grating can allow a transmission much higher than the filling factor for the normally incident light polarized perpendicularly to the grating. Some of the light aligned with the metal wire in the far field can transmit through the slots between the wires due to the scattering by the wire in the near field. In other words, the subwavelength grating can collect light in certain circumstances and focus the light into the slots. These slots can behave as waveguides to guide the light. Furthermore, if one integrates a reflector to eliminate transmission through the device and form nano-cavities, with an appropriate cavity length, one could localize photons inside the nano-cavities and strongly absorb photons using optical absorbers placed inside the nano-cavities where the electrical field is strong. Also, if one adjusts the period of the sub-wavelength metal grating, one can enhance the absorption further by promoting constructive interference of the optical field in the nanowire areas. Several physical effects can contribute to the operation of the nano-antennae described above. First, non-resonant nano-optical collection by a metallic slit can occur. Operation can also involve resonant enhancement of absorption by an optical nano-cavity backing the slit, which can localize the photons.

Third, resonant scattering of fields along the surface might also play a role, These effects can enhance the absorptance if optical absorbers (e.g., portions of the NbN nanowire) are positioned inside the nano-cavities. In such cases, there will be net energy flow going toward each slot in the near field, meaning that the nano-antenna structure collects the incident light and concentrates it in the nano-cavities.

The effects described above can be understood quantitatively by solving Maxwell equations by performing optical simulation on the whole structure. However, to provide some physical insight into the influence of each effect in isolation, one can start from a simple model with only one slot, add a retroreflector to create a cavity, and then add multiple cavities to produce multiple periodic slots.

Non-resonant nano-optical collection by the metal slit can increase the effective collection area for TM-polarized light beyond the geometric area of the slit. In other words, the subwavelength slit can collect and focus the light into the nanowire and nano-slit, acting like a feed gap. The existence of this collection effect in the near field was confirmed via finite-element simulation using a commercial software Comsol Multiphysics®. In the simulation, it was assumed that d=180 nm, w=80 nm, and p=600 nm. The simulation was performed assuming a sapphire substrate, NbN nanowire as an optical absorber, HSQ spacer on top of the NbN, and a gold grating and reflector, as fabricated in Example 2 below. The optical indices for NbN, $NbNO_x$, gold, HSQ, and sapphire used in simulation were 5.23+5.82i, 2.28, 0.55+11.51i, 1.39, and 1.75, respectively. In the calculations, the exterior boundary conditions for horizontal boundaries were scattering boundary conditions. For vertical boundaries, scattering boundary conditions were used when simulating a single slot (FIG. 5A) and periodic boundary conditions when simulating the meandering structure (FIG. 5D). When simulating a single slot, the width of sapphire used in the simulation was 20 micrometers.

Figure 5A:
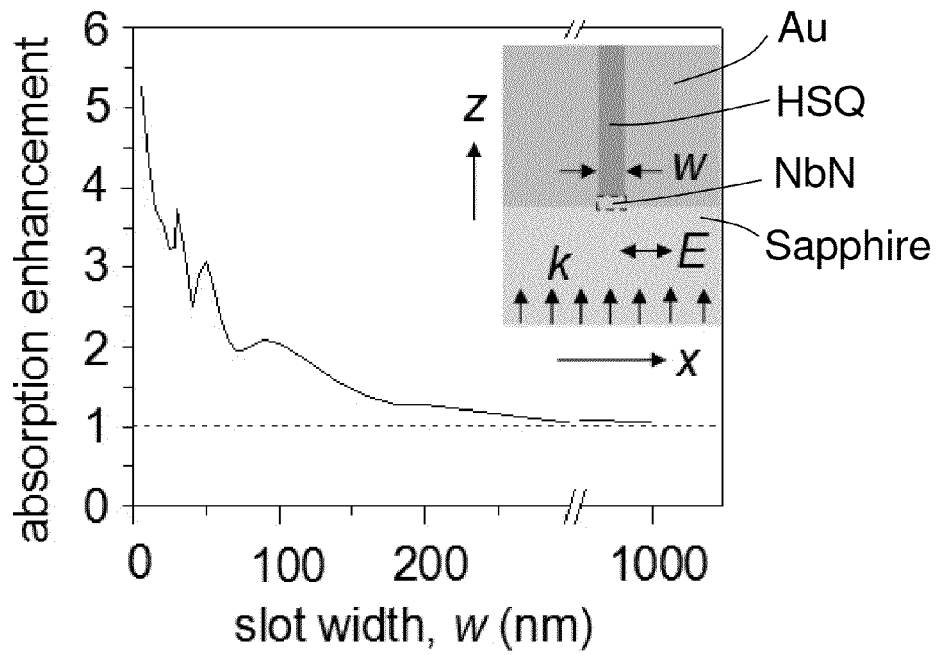
FIGS. 5A-5D include (A) an exemplary plot of absorption enhancement as a function of slot width, (B) an exemplary plot of intensity as a function of position, (C) an exemplary plot of absorption enhancement as a function of cavity length and (D) exemplary plots of the absorption enhancement and absolute absorptance as a function of period.

FIG. 5A includes a plot of the absorption enhancement as a function of w, where the absorption enhancement is defined as the ratio of absorption per unit width in the nanowire normalized to the absorption of an unpatterned NbN film. The absorption enhancement of an 80-nm wide (the value of the nanowire width in Example 2) NbN nanowire was approximately 2, and approached 1 in the limit of an infinitely wide slit. The absorption enhancement decreased almost monotonically with the slot width.

Figure 5B:
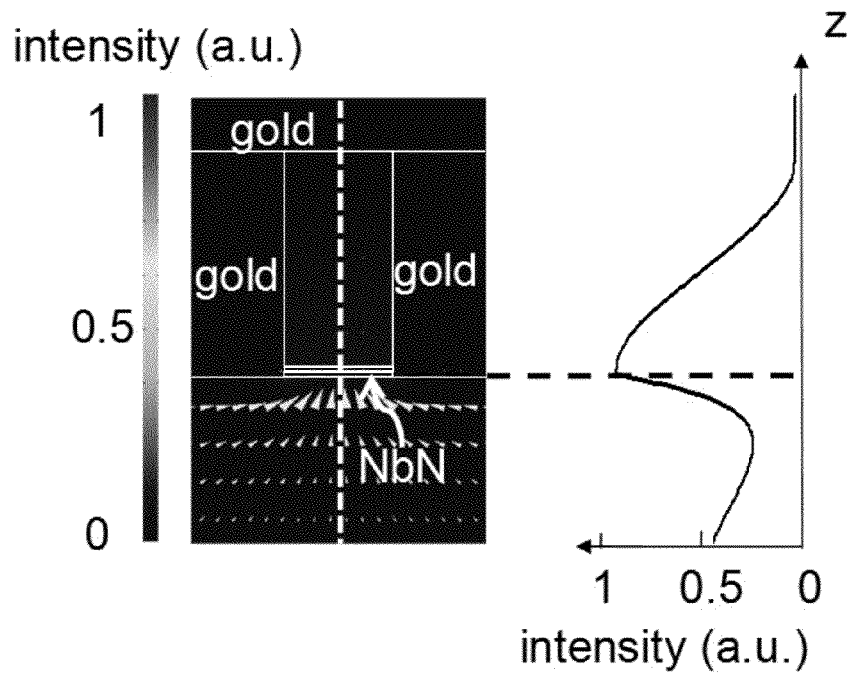

FIG. 5B includes a plot of the intensity distribution and the time-averaged Poynting vector for this simulation. The surface color represents the electrical field amplitude and the arrows show the time-average Poynting vectors. The collection effect of the optical nano-antennae can be clearly observed, and the NbN is positioned near the field maximum. It was also discovered that optical singularities such as vortices and saddle points appeared in the sapphire substrate if the period was larger than ~900 nm.

The almost monotonic decrease, together with the strongly enhanced electrical field observed in the simulation at the gold edge adjacent to the NbN, supports the existence of non-resonant edge scattering effects in this system.

Figure 5C:
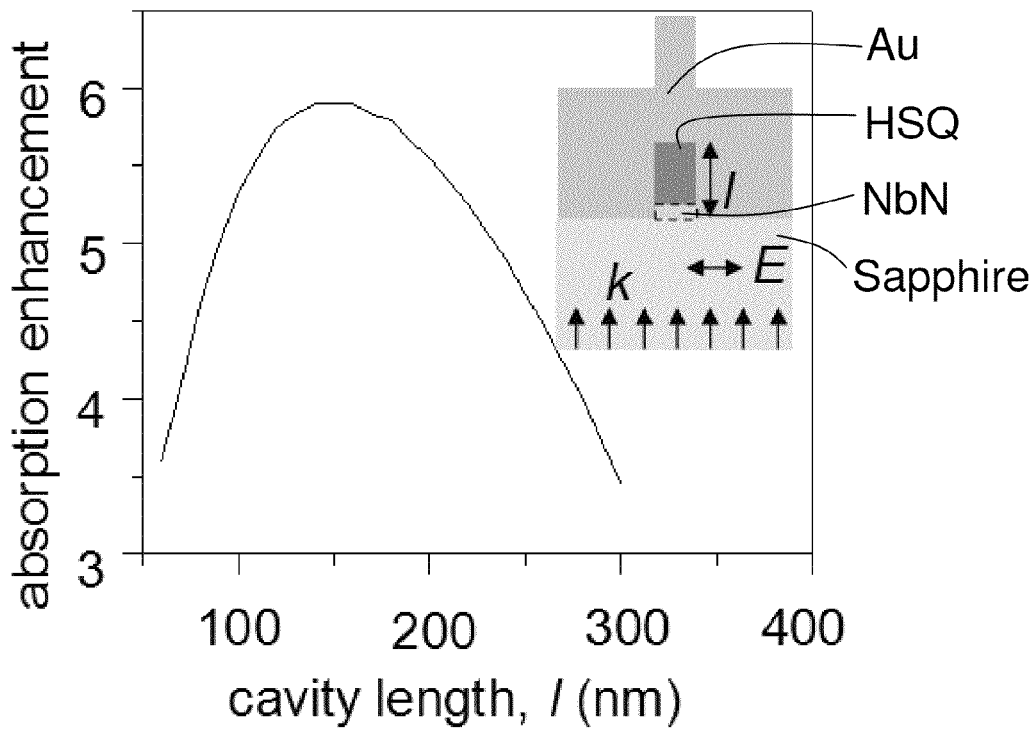
Figure 5D:
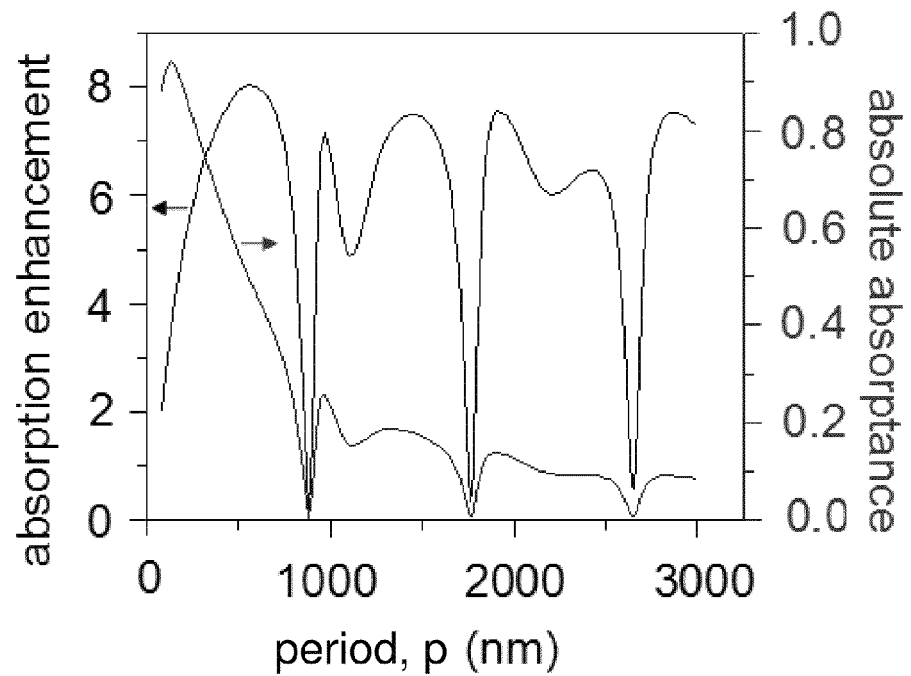

In addition to the non-resonant collection effect, the nano-cavities enhanced the absorption by enhancing the electrical field at the location of optical absorber. Not wishing to be bound by any particular theory, this enhancement may have been due to cavity resonance. Each metal-insulator-metal slot can behave as a resonant optical waveguide, while a reflector behind the waveguide forms a quarter-wavelength cavity, greatly reducing optical transmission and reducing reflection. The photons can thus be strongly absorbed by the nanowire placed at the waveguide aperture, where the electrical field is very large, i.e. at the field anti-node created by the quarter-wave resonator. An optical simulation was performed on a single cavity, and the cavity length, l (defined as the vertical distance from the top of the HSQ to the sapphire-NbN interface) was adjusted. FIG. 5C includes a plot of the absorptance enhancement of the NbN nanowire as a function of cavity length, l. A cavity length of 150 nm enhanced the absorption in the NbN by a factor of about 6. Because this calculation also included the feed-gap-like collection effect discussed above, one can attribute a factor of about 3 to the absorption enhancement to the cavity effect. Furthermore, the decrease in absorption enhancement for either shorter or longer cavity length is slow, permitting a relatively wide tolerance of cavity length inaccuracy in fabrication.

FIG. 5D presents the calculated absorption enhancement and absolute absorptance, defined as the absorbed optical power normalized to incident optical power, as a function of period, p, fixing the w and l to be the experimental values 80 nm and 180 nm, respectively. This calculation includes the non-resonant and cavity effects as well as a third effect that can be attributed to resonant scattering of the field at the gold-sapphire interface. At small periods, the absorption enhancement was suppressed because the antenna aperture of each unit cell overlaps that of adjacent cells. By increasing the period, more light is concentrated into each slot and absorbed by the NbN nanowire. The absorptance enhancement factor could saturate for large periods if each individual antenna did not interfere with the others. However, when the period of the NbN nanowire is equal to about λ/n, where n is the optical index of sapphire, most of the incident light is reflected by the gold instead of being coupled to the optical nano-cavities and NbN nanowire. Therefore, the absorption of the NbN is lowered. The interface between sapphire and nano-structured gold can behave as a frequency selective surface. The initial increase of absorption enhancement with period and the minimum at p=886 nm resulted in a peak of absorption enhancement at about 600 nm, which was therefore chosen for our experiment. Correspondingly, the largest observed absorption enhancement was about 8, about 25% of which could have been due to this frequency-selective-surface effect. For a 600-nm period, the absolute absorptance was calculated to be about 47% for TM-polarized light.

EXAMPLE 2

This example, describes the fabrication and testing of an SNSPD integrated with optical nano-antennae and nano-cavities, similar to the concept described in Example 1. The SNSPD was composed of a 135-micron long NbN nanowire wound in a boustrophedonic pattern with a period of 600 nm to cover an effective area of 9 microns×9 microns.

Starting from a 4.5-nm thick niobium nitride (NbN) film on sapphire substrate, gold contact pads were fabricated. About 1 micron of S1813, a positive tone photoresist, was spun onto the film-covered substrate. The chip was baked in ambient air at 90° C. for 3 minutes, optical lithography was performed to define the pads, and the resist was developed. After evaporating 10 nm titanium (Ti) and 50 nm gold (Au) films, liftoff was performed in 90° C. NMP solvent (1-methyl-2-pyrrolidinone). The Ti layer was used to enhance the adhesion between Au and NbN. Next, about 300 nm of hydrogen silsesquioxane (HSQ), a negative tone electron beam resist, was spun onto the device. Scanning electron beam lithography was performed at 30 keV to define the nanowire meander structure. This was followed by developing the HSQ in 25% tetramethylammonium hydroxide (TMAH) for 4 minutes at about 20° C. Reactive ion etching was used to remove portions of the NbN, using the HSQ as a mask such that the pattern in the HSQ was transferred to the NbN. In the reactive ion etching step, $CF_4$ was used as the reactive gas, and 98 W RF power was used for 100 sec. The resulting thicknesses of the HSQ, as measured by both atomic force microscope and analyzing a scanning electron beam cross sectional image, were 180±20 nm.

To integrate the nanowire detector with the optical nano-antennae and nano-cavities, about 1 micron of S1813 was spun on a second time. Optical lithography was performed, aligning with the detector, to open a window of 25 microns by 25 microns for the gold antenna structure. Next, about 6 nm of $SiO_2$ was evaporated for electrically insulating the nanowire from the Ti and Au. This was followed by evaporating about 3 nm Ti and about 300 nm Au. A liftoff step was then performed in 90° C. NMP, resulting in the device shown in FIGS. 6A-6B.

Figure 6A:
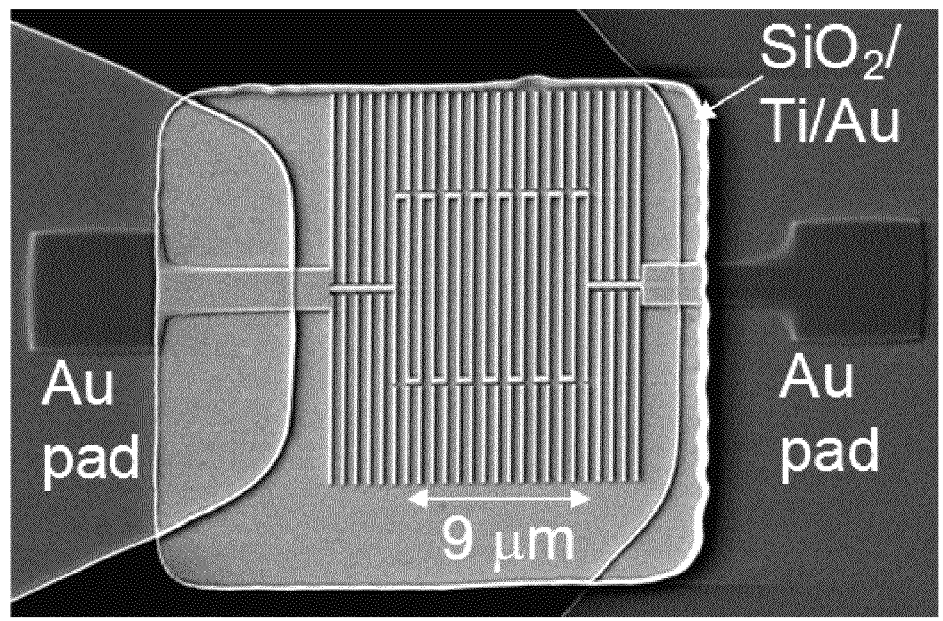
FIGS. 6A-6D include (A-B) scanning electron micrographs of an exemplary photon detector, and (C-D) cross-sectional schematic illustrations of an exemplary photon detector.
Figure 6B:
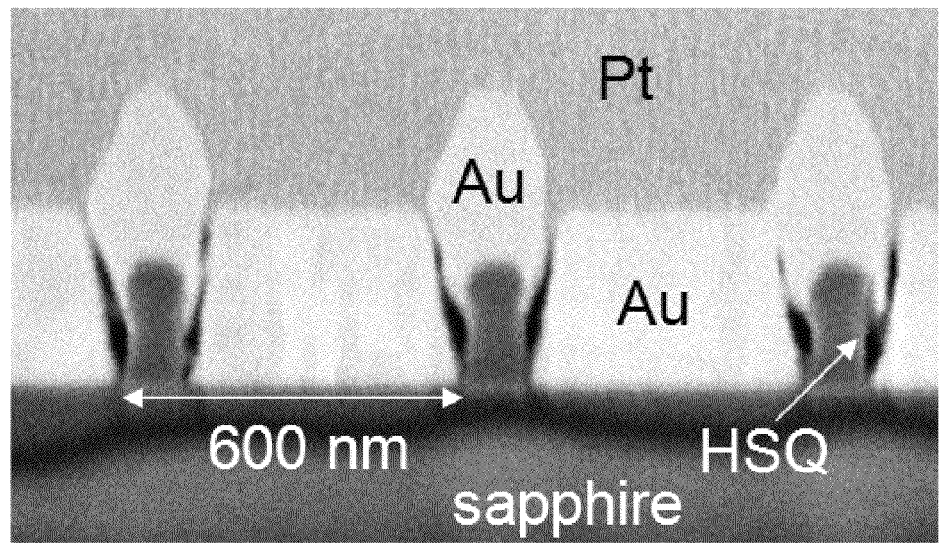
Figure 6C:
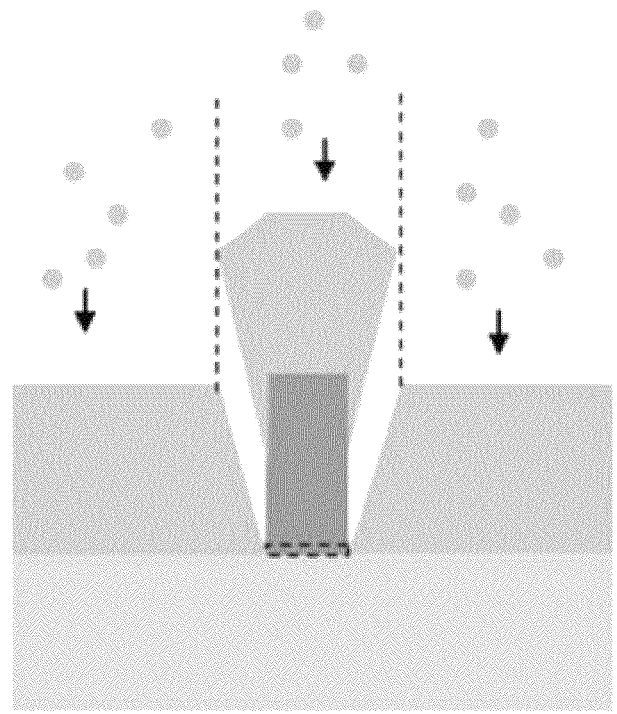
Figure 6D:
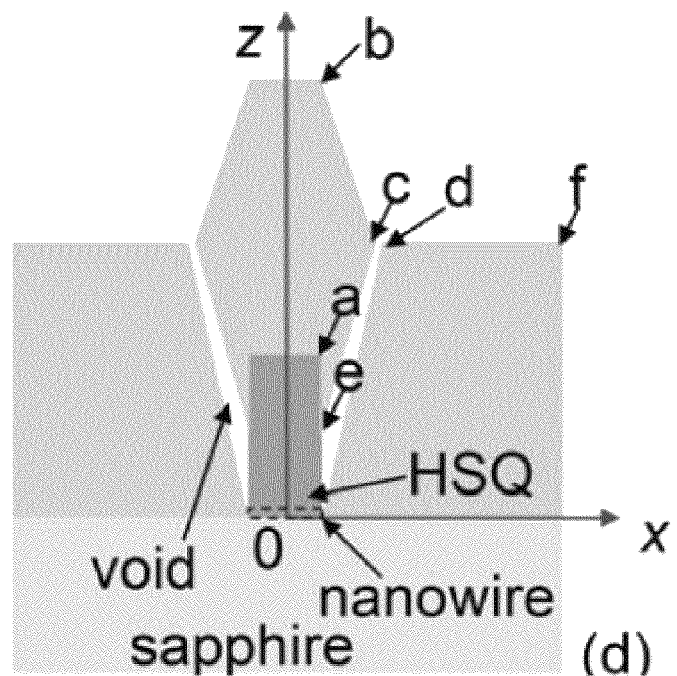

FIGS. 6A-6B include scanning electron micrographs of the resulting detector from a top view (FIG. 6A) and a cross section cut by focused ion beams using a Zeiss NVision 40 dual beam system (FIG. 6B). The HSQ pillars were about 80 nm wide and about 180 nm tall. The NbN nanowire itself was under the HSQ pillar and is not visible on the micrograph. The gold between HSQ pillars forms optical nano-antennae and together with the gold on top of HSQ pillars, forms nano-cavities. Each gold structure between two adjacent HSQ pillars was in a shape of trapezoid. In some cases, voids appeared between the gold and HSQ pillars because the gold on top of HSQ pillars migrated during the evaporation process, which gradually shadowed the evaporation afterwards, as illustrated schematically in FIG. 6C. These voids could be eliminated by using a two-angle evaporation process to coat the sidewalls of HSQ with gold. FIG. 6D includes a schematic of the cross-section, based upon the image in FIG. 6B, which was used as the geometry in the optical simulation of the optical absorptance of the NbN nanowire. To define the structure in FIG. 6D, a coordinate system was established. The x and z coordinates (in nm) for the points a, b, c, d, e, f in FIG. 6D are (40, 186.5), (40, 486.5), (110, 300), (120, 300), (40, 90), (300, 300).

Figure 7:
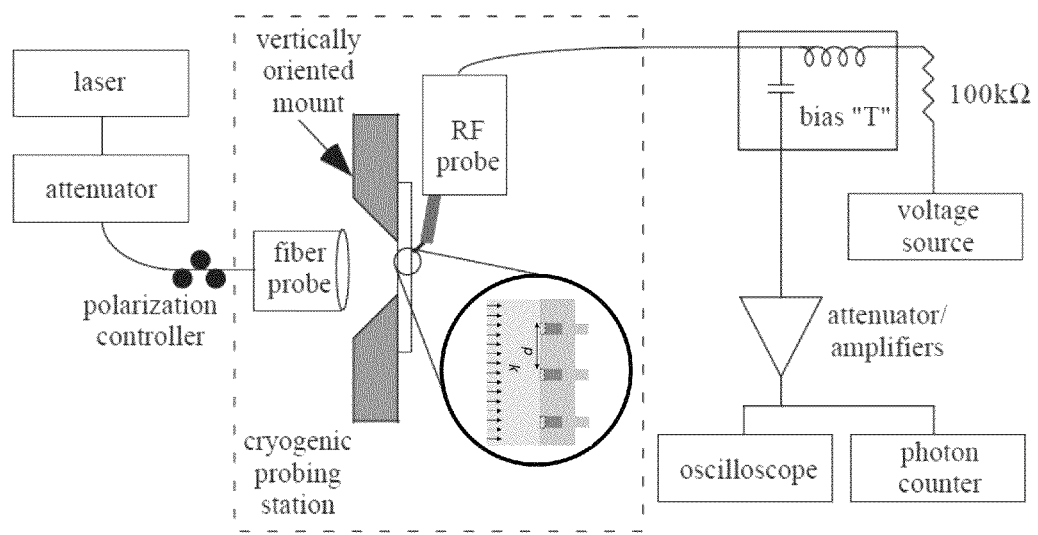
FIG. 7 includes an exemplary schematic of an experimental setup.

The SNSPD integrated with optical nano-antennae and nano-cavities was tested in a probing station at 2.1 K. The setup used to measure the electrical and optical response of the photon-counting devices, described previously in K. M. Rosfjord, et al., *Optics Express*, 14 527-34 (2006), is shown in FIG. 7. This setup included three major subsystems: (1) the cryogenic probing station; (2) the room-temperature electronics; and (3) the pulsed optical source. The detector chip was mounted on a chip-holder, and the chip holder was mounted onto the cold head of the probing station. Electrical contact with the devices was established using a 65-GHz RF probe connected to a coaxial cable and mounted on a micromanipulator arm, so that it could be touched down to any individual device on the sample. The probe was cooled to less than 30K using copper braids connected to the 4.2K stage of the probing station. An optical fiber and lens assembly was mounted to a second cooled micromanipulator, whose position was controlled using an automated, closed-loop three-axis positioning stage with submicron resolution (MICOS GmbH). This stage allowed the optical spot produced by the lens to be aligned automatically with any device using that device's photon count rate as feedback.

A room-temperature readout-electronics subsystem was connected to the cold RF probe through coaxial cable and a vacuum feedthrough. First, a 0.5 m length of coaxial cable was used to provide a delay that temporally separated any spurious electrical reflections from the output pulses of our devices. This cable was connected to a bias tee. Current bias was supplied to the devices through the DC port of the bias tee using a battery-powered voltage source in series with a 100 k$\Omega$ resistor. The AC port of the bias tee was connected to two cascaded wideband, low-noise amplifiers (MITEQ JS2-00100400-10-10A, 27 dB gain, 0.1-4 GHz) through a 3 dB attenuator.

The amplifier output was sent through a DC block and split using a resistive splitter to be sent into both a photon counter and a 6-GHz, real-time oscilloscope. For the detection-efficiency measurements, the photon counter was used to count the number of electrical output pulses resulting from a fixed number of highly attenuated (less than 0.25 incident photons per pulse) optical pulses. The signal-to-noise ratio of the amplified voltage pulses was sufficiently high that the discriminator threshold level at the input of the counter could be varied over a wide range without changing the observed count rate. In order to reject counts not directly associated with the optical excitation, the counter was operated in a gated mode in which only those pulses arriving within a fixed 5-ns-long window were counted. This window was centered on the arrival time of detection events generated by the optical pulses by triggering the gate synchronously with the laser's output pulses, and then adjusting the gate delay. In addition, a dark-count-noise baseline was taken of counts recorded in the gate window with the light blocked mechanically. This baseline was subtracted from each measurement.

Figure 8:
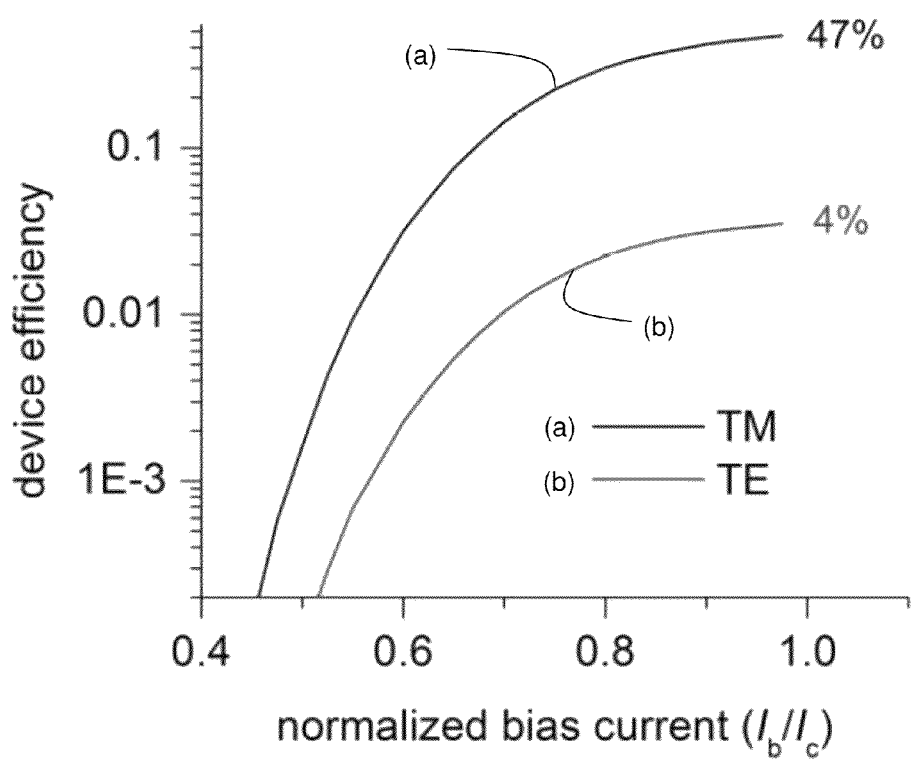
FIG. 8 includes, according to one set of embodiments, a plot of device efficiency as a function of normalized bias current.

During experiments, the detector was illuminated by a pulsed laser at a wavelength of 1550 nm through an optical filter, with a pulse repetition rate of 10 MHz. This light was attenuated to the single-photon level using a precision optical attenuator and calibrated using an InGaAs power meter at power levels 30 dB above its noise floor. Varying the polarization of the light using a fiber polarization controller resulted in a change in the count rate. The polarization controller was rotated in the optical illumination path to maximize or minimize the counting rate. The polarization with maximized and minimized counting rates were labeled TM and TE, respectively. FIG. 8 includes a plot of device efficiency for both polarizations as a function of normalized bias current, which is defined as the bias current divided by the critical current of the superconducting nanowire. Once the detector was biased at 95% of its critical current, $I_c$, which was 11.7 microamps, the device efficiency reached 47% and 4% for TM- and TE-polarizations, respectively.

In these experiments, the back side of the sapphire substrate was not coated with an antireflection coating (ARC). Assuming a 7.4% reflectance at the air-sapphire interface (consistent with theoretical calculations), the corrected device efficiencies for TM- and TE-polarizations were about 50% and about 4%, respectively. Not wishing to be bound by any particular theory, the suppression of the response to TE-polarized incident light might have been due to the fact that the nano-cavities did not support TE-modes, and most of the incident TE-polarized light might have been reflected.

It is also interesting to consider the response to TM-polarization. Considering the filling factor of the NbN nanowire was about 13%, a significant amount of light, which was aligned with the gold in the far field, might have been coupled into the NbN nanowire in the near field. Because the device efficiency is a product of absorptance and internal detection efficiency (the probability of resistive state formation after absorbing one photon, which is <1), from the measured device efficiency, one can infer that the absorption of NbN nanowire must have been greater than 50% for TM-polarization, which would be substantially impossible without the integration of optical nano-antennae and nano-cavities for the NbN nanowire on sapphire substrate.

The simulated absorptance of the meander with ARC on the back of the sapphire substrate was 44% and 2.4% for TM- and TE-polarizations, respectively. Not wishing to be bound by any particular theory, the discrepancy between the inferred absorptance from the measured device efficiency and the simulated absorptance might have been due to the errors of the optical indices used in the simulation, the approximations that were used in the simulation, the fact that the simulation did not include the $SiO_2$ and Ti under the gold, and/or the errors of the measurement of the device efficiency. If there were no voids yielded in the evaporation process, the simulated absorptance for TM- and TE-polarizations would be 46% and 2.1%, respectively. This slight decrease of absorptance for TM and increase for TE due to the voids were not unexpected because the voids made the structure behave as a less effective nano-antennae and nano-cavities for TM polarization and a less effective minor for TE-polarization.

Another difference is that the simulated absorptance for the meander with the same period and optimized Fabry-Perot microcavity (as opposed to the nano-antennae and nano-cavities) is 25% and 12% for TE- and TM-polarizations, respectively. Basd on this difference, one can conclude that the effect of the optical nano-antennae for collecting the TM-polarized and the nano-cavities for enhancing the field were demonstrated unambiguously.

The speed of SNSPDs, considered to be one of the major advantages of this technology, quantifies how fast the detector can count photons, and can be defined as $1/\tau$, where $\tau$ is the reset time (defined above). To evaluate the speed of the detector, the kinetic inductance, $L_k$ of the detector was measured to be about 100 nH using a network analyzer. The recovery of the bias current, (and therefore, the detection efficiency), was limited by this kinetic inductance. From the measured inductance and the relation of detection efficiency vs. bias current, a 90%-effciency recovery time of 5 ns was measured. From this identified bias current and the exponential recovery with a time constant $L_k/50\Omega$ of bias current after returning to the superconducting state, it was determined that the 90% device-efficiency recovery time was about 5 ns.

In many SNSPDs, a tradeoff between system detection efficiency and speed exists. This tradeoff can be characterized by a speed-efficiency product, which is defined as previously described:

$$SEP = \frac{A\eta}{\tau} \quad [1]$$

wherein A is the active area, $\eta$ is the device efficiency, and $\tau$ is the reset time. Generally, it is desirable to increase the speed-efficiency product of a SNSPD. The SNSPD integrated with optical nano-antennae and nano-cavities tested in this example produced a relatively high speed-efficiency product, relative to traditional SNSPDs integrated with a Fabry-Parot cavity. Compared with the device described in Hu et al., Opt. Lett. 34, 3607-3609 (2009), the antenna-integrated SNSPD tested in this example had a similar active area, but a device detection efficiency 1.57 times larger and a recovery time 5 times smaller, thus yielding an enhancement factor of 7.85 for the speed-efficiency product. The higher device detection efficiency of this detector was likely due to the reduced length of the nanowire, which was achieved by integrating the nano-antennae and nano-cavities. Using a shorter nanowire reduced the probability of constrictions (defects yielded during film deposition or nanofabrication process) which are considered to be a limiting factor of the device efficiency. In addition, the reduced length of the nanowire contributed to the reduced recovery time. Because of the similar active area, the detector described in this example could couple at least 80% of the incident light were it installed in the cryocooler system reported in Hu et al. Thus, from the point of view of the system detection efficiency, the speed-efficiency product has been increased by a factor of 7.85.

Rosfjord, et al. have reported device efficiencies of 57%, (See Rosfjord, K. M., et. al., Nanowire single-photon detector with an integrated optical cavity and anti-reflection coating, Opt. Express 14, 527-534 (2006)). The SNSPD integrated with optical nano-antennae and nano-cavities tested in this example has an effective active area 9 times larger, while achieving close to the same efficiency, making the coupling of light to the detector from other classical optoelectronic components including fiber or other waveguides or free space much more efficient.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
   forming a layer of a first electrically insulating material adjacent a layer of electrically superconductive material;
   removing a portion of the first electrically insulating material to form a first pattern of the first electrically insulating material and exposed superconductive material;
   removing at least a portion of the exposed electrically superconductive material to form a second pattern of electrically superconductive material which substantially corresponds to the first pattern of the first electrically insulating material, wherein the second pattern of electrically superconductive material forms at least one nanowire and comprises a plurality of substantially equally spaced elongated portions defining a period of at least about 250 nm; and
   forming a layer of electrically conductive material over the first electrically insulating material.

2. A method as in claim 1, wherein forming the layer of the first electrically insulating material comprises spin-coating the layer of the first electrically insulating material.

3. A method as in claim 1, wherein the first electrically insulating material is used as a mask during the removal of the electrically superconductive material.

4. A method as in claim 1, further comprising:
   forming a layer of a second electrically insulating material and/or a layer of semiconductor material between the layer of first electrically insulating material and the layer of electrically conductive material.

5. A method as in claim 1, wherein removing at least a portion of the electrically superconductive material comprises exposing a material over which the electrically superconductive material is positioned.

6. A method as in claim 1, wherein removing a portion of the first electrically insulating material and/or removing at least a portion of the electrically superconductive material comprises etching the first electrically insulating material and/or the electrically superconductive material.

7. A method as in claim 6, wherein removing a portion of the first electrically insulating material comprises removing a portion of the first electrically insulating material via scanning electron beam lithography.

8. A method as in claim 6, wherein removing at least a portion of the electrically superconductive material comprises reactive ion etching the superconductive material.

9. A method as in claim 1, wherein the plurality of portions are substantially parallel.

10. A method as in claim 1, wherein the plurality of portions are substantially concentric.

11. A method as in claim 1, wherein:
    the electrically superconductive material is positioned over a substrate, and
    the period is between about $0.45(\lambda/n)$ and about $0.9(\lambda/n)$, wherein $\lambda$ is the wavelength of electromagnetic radiation, as measured in a vacuum, to which the electrically superconductive material is designed to be exposed, and n is the index of refraction of the substrate.

12. A method as in claim 11, wherein the electrically superconductive material is in direct contact with the substrate.

13. A method as in claim 1, wherein the plurality of substantially equally spaced portions are part of a serpentine pattern.

14. A method as in claim 1, wherein forming the layer of electrically conductive material comprises evaporating the electrically conductive material.

15. A photon detector comprising an electrically superconductive nanowire wherein the active area defined by the nanowire times the device efficiency divided by the reset time of the detector is at least about 3 microns$^2$/nanosecond.

16. A photon detector as in claim 15, wherein the detector is constructed and arranged to detect at least one wavelength of infrared electromagnetic radiation, as measured in a vacuum.

17. A photon detector as in claim 15, wherein the detector is capable of maintaining an efficiency of at least about 20% while the active area defined by the nanowire times the device efficiency divided by the reset time of the detector is at least about 3 microns$^2$/nanosecond.

18. A photon detector as in claim 15, wherein the detector comprises a superconducting nanowire single-photon detector.

19. An article, comprising:
    an electrically superconductive material and a resonance structure positioned over the electrically superconductive material, wherein the resonance structure is constructed and arranged to include at least one dimension that is resonant with electromagnetic radiation to which the article is designed to be exposed.

20. An article as in claim 19, wherein the resonance structure is constructed and arranged to include at least one cross-sectional dimension that is between about 0.15 and about 0.35 times the effective wavelength of the electromagnetic radiation, within the resonance structure, to which the electrically superconductive material is designed to be exposed.

21. An article as in claim 20, wherein the cross-sectional dimension is substantially perpendicular to a plane defined by the electrically superconductive material.

22. An article as in claim 19, further comprising an electrically conductive material over the electrically superconductive material, the electrically conductive material comprising a plurality of protrusions at least two of which form a feed gap constructed and arranged to enhance the field of electromagnetic radiation to which the article is designed to be exposed.

23. An article, comprising:
an electrically superconductive material and an electrically conductive material positioned over the electrically superconductive material, the electrically conductive material comprising a plurality of protrusions at least two of which form a feed gap that enhances the field of electromagnetic radiation to which the article is designed to be exposed.

24. An article, comprising:
a layer of electrically superconductive material positioned over a substrate and formed in a first pattern including at least one nanowire and comprising a plurality of substantially equally spaced elongated portions defining a period of between $0.45(\lambda/n)$ and about $0.9(\lambda/n)$, wherein $\lambda$ is the wavelength of electromagnetic radiation, as measured in a vacuum, to which the electrically superconductive material is designed to be exposed, and n is the index of refraction of the substrate;
a layer of a first electrically insulating material positioned over the electrically superconductive material in a second pattern substantially corresponding to the first pattern of electrically superconductive material;
a layer of a second electrically insulating material different from the first electrically insulating material and/or a layer of a semiconductor material, positioned over the first electrically insulating material; and
a layer of electrically conductive material positioned over the layer of second electrically insulating material and/or the layer of semiconductor material.

25. An article as in claim 24, wherein the plurality of substantially equally spaced elongated portions are substantially parallel.

26. An article as in claim 24, wherein the plurality of substantially equally spaced elongated portions are substantially concentric.

27. An article as in claim 24, wherein the period is at least about 250 nm.

28. An article as in claim 24, wherein the electrically superconductive material is in direct contact with the substrate.

29. An article as in claim 24, wherein the plurality of substantially parallel portions are part of a serpentine pattern.

30. A method as in claim 1, wherein the thickness of the electrically superconductive material is less than about 20 nm.

31. A method as in claim 1, wherein the thickness of the first electrically insulating material is at least about 50 nm.

32. A method as in claim 1, wherein the electrically superconductive material comprises niobium.

33. A method as in claim 1, wherein the electrically superconductive material comprises NbN, niobium metal, and/or NbTiN.

34. A method as in claim 1, wherein the first electrically insulating material comprises hydrogen silesquioxane.

35. A method as in claim 4, wherein the second electrically insulating material comprises silicon dioxide.

36. A method as in claim 4, wherein the semiconductor material comprises silicon.

37. A method as in claim 1, wherein the electrically conductive material comprises gold, silver, aluminum, and/or platinum.

38. A method as in claim 1, wherein the electrically superconductive material is positioned over a substrate.

39. A method as in claim 1, wherein the electrically superconductive material is in direct contact with a substrate.

40. A method as in claim 1, wherein the electrically superconductive material is in direct contact with the first electrically insulating material.

41. A method as in claim 4, wherein the first electrically insulating material is in direct contact with the second electrically insulating material.

42. A method as in claim 38, wherein the substrate comprises sapphire.

43. A method as in claim 1, further comprising an adhesion promoter positioned between the electrically conductive material and at least one of the first and second electrically insulating materials.

44. A method as in claim 43, wherein the adhesion promoter comprises titanium.

* * * * *